United States Patent
Joshi et al.

(10) Patent No.: US 7,532,501 B2
(45) Date of Patent: May 12, 2009

(54) SEMICONDUCTOR DEVICE INCLUDING BACK-GATED TRANSISTORS AND METHOD OF FABRICATING THE DEVICE

(75) Inventors: Rajiv V. Joshi, Yorktown Heights, NY (US); Keunwoo Kim, Somers, NY (US); Edward Joseph Nowak, Essex Junction, VT (US); Richard Quimby Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/142,248

(22) Filed: Jun. 2, 2005

(65) Prior Publication Data

US 2006/0274569 A1    Dec. 7, 2006

(51) Int. Cl.
*G11C 11/00* (2006.01)
(52) U.S. Cl. ............... 365/154; 365/185.18; 365/185.27
(58) Field of Classification Search .................. 365/154, 365/185.27
See application file for complete search history.

(56) References Cited

U.S. PATENT DOCUMENTS

| | | | |
|---|---|---|---|
| 5,986,924 A * | 11/1999 | Yamada | 365/154 |
| 6,433,609 B1 * | 8/2002 | Voldman | 327/313 |
| 6,462,585 B1 * | 10/2002 | Bernstein et al. | 327/55 |
| 6,919,647 B2 * | 7/2005 | Hackler et al. | 257/250 |
| 2004/0125681 A1 * | 7/2004 | Yamaoka et al. | 365/229 |
| 2005/0017377 A1 * | 1/2005 | Joshi et al. | 257/903 |
| 2005/0130358 A1 * | 6/2005 | Chidambarrao et al. | 438/197 |
| 2005/0218427 A1 * | 10/2005 | Joshi et al. | 257/192 |
| 2006/0232321 A1 * | 10/2006 | Chuang et al. | 327/427 |

* cited by examiner

*Primary Examiner*—Huan Hoang
*Assistant Examiner*—Anthan T Tran
(74) *Attorney, Agent, or Firm*—Brian P. Verminski; McGinn IP Law Group, PLLC

(57) ABSTRACT

A memory cell (e.g., static random access memory (SRAM) cell) includes a plurality of back-gated n-type field effect transistors (nFETs), and a plurality of double-gated p-type field effect transistors (pFETs) operatively coupled to the plurality of nFETs.

16 Claims, 20 Drawing Sheets

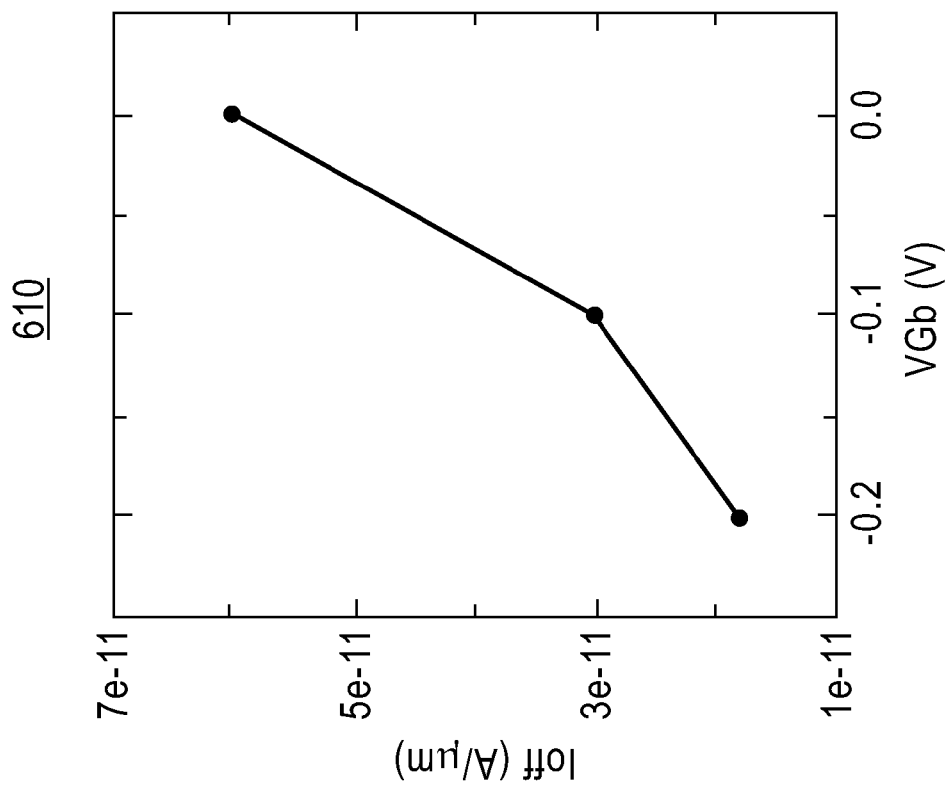
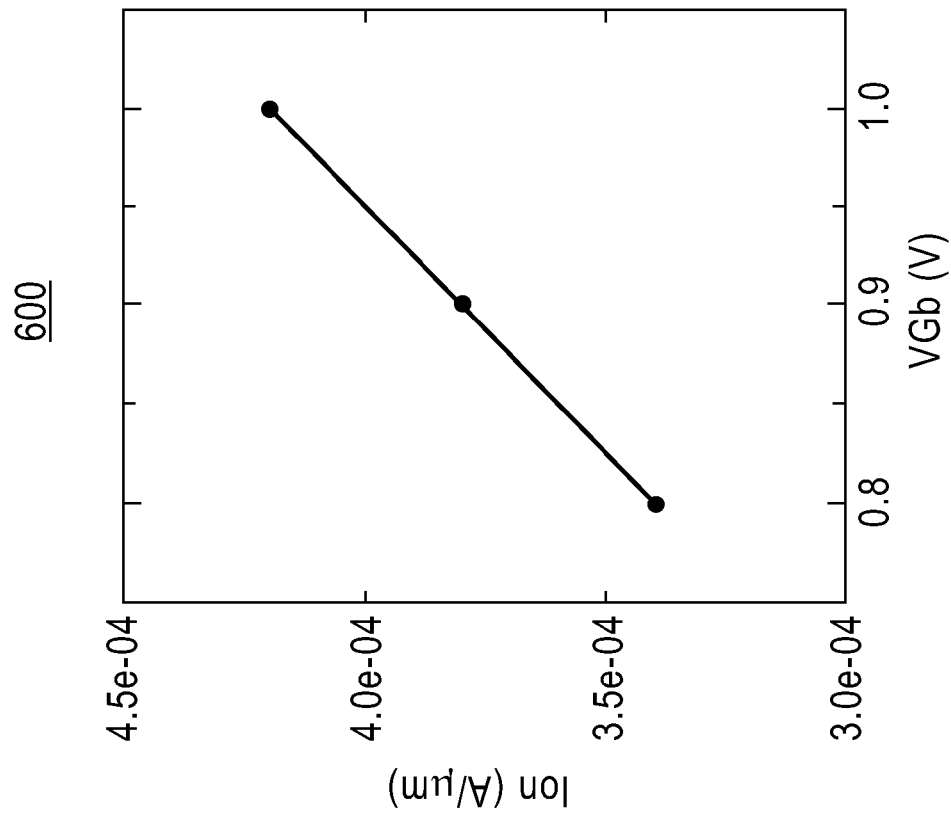
FIG. 6B
FIG. 6A

SEMICONDUCTOR DEVICE INCLUDING BACK-GATED TRANSISTORS AND METHOD OF FABRICATING THE DEVICE

BACKGROUND OF THE INVENTION

1. Field of the Invention

The present invention relates to a semiconductor device (e.g., a static random access memory (SRAM) device) including back-gated transistors, and more particularly, to a device which includes a back-gate transistor which may be fabricated using finFET technologies (e.g., a coupled backgate finFET SRAM).

2. Description of the Related Art

FIG. 1 provides a circuit diagram illustrating a conventional six transistor (6-T) SRAM device 100. As illustrated in FIG. 1, the conventional SRAM device 100 includes n-type field effect transistors (nFETs) N1-N4, and p-type field effect transistors (pFETs) P1-P2. The word line (wl) is coupled to the gates of nFETs N3, N4 and the bit lines blt, blc are coupled to an arm of nFETs N3, N4, respectively.

In advanced semiconductor devices (e.g., such as the conventional SRAM device 100), dopant fluctuations are becoming a serious problem in Vt (threshold voltage) control. As semiconductor devices become smaller and smaller, Vt control becomes more difficult. This problem greatly affects SRAM devices since the SRAM devices may be very small.

A known solution to this problem is to control the Vt by using back-gates in the semiconductor devices. One serious problem with this solution, however, is that the use of back-gates in semiconductor devices results in increased layout complexity, and therefore, higher cost. In addition, separately back gating the individual devices increases wiring densities and does not help in the layout compactness.

SUMMARY OF THE INVENTION

In view of the foregoing and other exemplary problems, disadvantages, and drawbacks of the aforementioned conventional systems and methods, it is a purpose of the exemplary aspects of the present invention to provide a memory cell and method of fabricating the memory cell which may be used to provide a semiconductor structure in which back-gates may be formed with relatively less layout complexity, and a method for forming the semiconductor structure.

In addition, present invention may help to increase the device density of the novel semiconductor structure. The present invention may also improve the stability of a device (e.g., an SRAM device) by coupling the back-gates of the proper nFET devices in the SRAM. In addition, the present invention may be used to apply a proper biasing condition.

The present invention includes a memory cell (e.g., static random access memory (SRAM) cell) which includes a plurality of back-gated nFETs, and a plurality of double-gated pFETs, which are operatively coupled to the plurality of nFETs.

In another exemplary aspect, a memory cell includes a plurality of back-gated, split gate n-type field effect transistors (nFETs), and a plurality of trigate p-type field effect transistors (pFETs), which are operatively coupled to the plurality of nFETs.

In still another exemplary aspect, a memory cell includes a plurality of back-gated, trigate n-type field effect transistors (nFETs) which are gated by a gate electrode formed below a body of the back-gated trigate FETs, and a plurality of trigate p-type field effect transistors (pFETs), which are operatively coupled to the plurality of nFETs.

In another aspect of the present invention, a static random access memory (SRAM) cell includes a plurality of back-gated field effect transistors (FETs) (e.g., nFETs), biasing of the back-gated FETs being adjustable to an operating condition of the memory cell, and a plurality of double-gated FETs (e.g., pFETs), which are operatively coupled to said plurality of back-gated FETs.

In another aspect of the present invention, an SRAM array includes a plurality of SRAM cells according to the exemplary aspects of the present invention, and a plurality of wordlines (e.g., and a plurality of bias lines) which are operatively coupled to the plurality of SRAM cells.

In another aspect of the present invention, a method of fabricating a back-gate semiconductor memory device includes forming a plurality of single gate finFETs on a semiconductor substrate, the finFETs (e.g., each of the finFETs) including a gate oxide, masking some of the plurality of single gate finFETs, etching the other of the plurality of single gate finFETs to expose the gate oxide, and wiring gates of the other of the plurality of single gate finFETs.

BRIEF DESCRIPTION OF THE DRAWINGS

The foregoing and other exemplary purposes, features, aspects and advantages will be better understood from the following detailed description of the exemplary embodiments of the invention with reference to the drawings, in which:

FIGS. 6A-6B provide graphs 600, 610, illustrating Ion and Ioff simulation for the scheme (e.g., a larger-than-VDD scheme), respectively;

DETAILED DESCRIPTION OF THE EXEMPLARY EMBODIMENTS OF THE INVENTION

Figure 1:
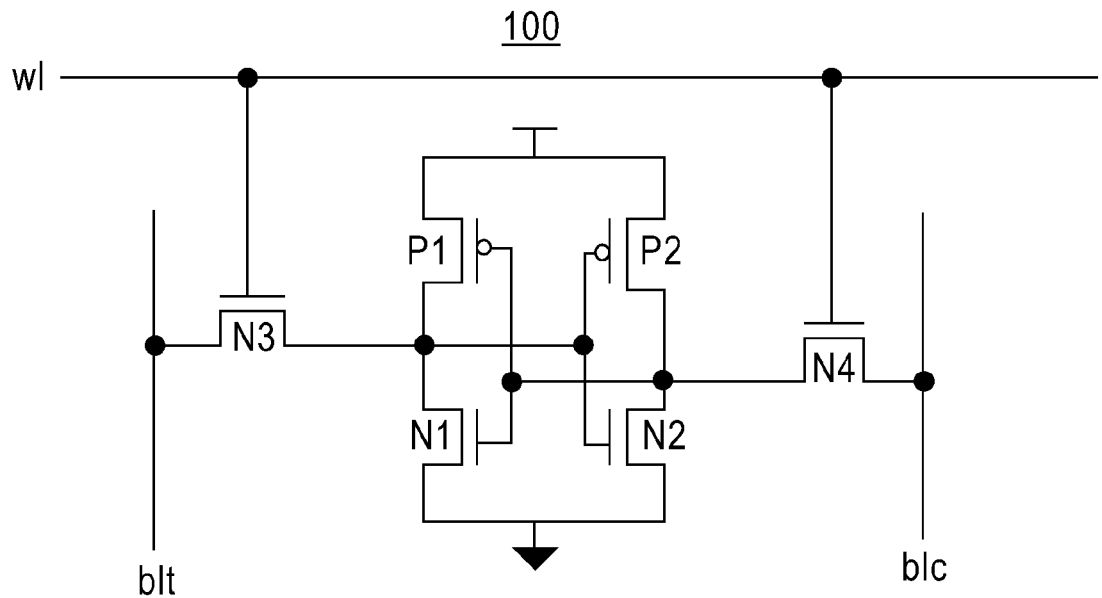
FIG. 1 provides a circuit diagram illustrating a conventional 6-T transistor SRAM device 100.

Referring now to the drawings, FIGS. 2-13H illustrate the exemplary aspects of the present invention.

The present invention provides a compact, coupled back-gating structure for a static random access memory (SRAM) device.

Referring again to FIG. 1, the inventors have recognized that by coupling the gates in the SRAM device (e.g., coupling the gates in the form of a finFET) the layout complexities can be reduced. In addition, the inventors have recognized that a forward bias that is larger than Vdd (e.g., a larger-than Vdd scheme) may help to improve the delay (e.g., in an active mode), while a reverse bias may lower the leakages of the SRAM cells in standby mode.

Figure 2A:
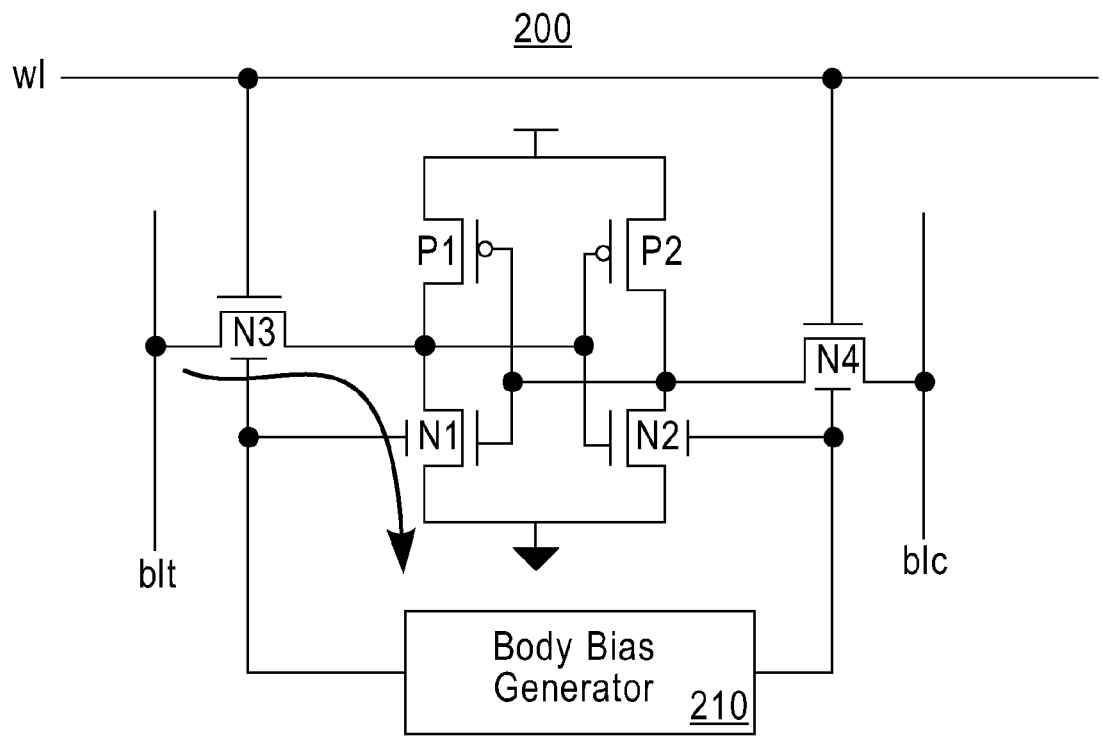
FIG. 2A provides a circuit diagram illustrating a memory cell 200 (e.g., a 6-T SRAM finFET cell) according to the exemplary aspects of the present invention.

FIG. 2A provides a circuit diagram illustrating a memory cell 200 (e.g., a 6-T SRAM finFET cell) according to the exemplary aspects of the present invention. The pFETs (e.g., P1, P2) can be operating in double-gate mode, and the back-gates of the nFETs N1, N3 (e.g., as a pair) and nFETs N2, N4 (e.g., as a pair) can be connected together. The back-gates could be asymmetrical (e.g., formed with n+ front and back as p+). The memory cell 200 may include a coupled back-gate bias SRAM cell with forward bias exceeding Vdd and reverse bias below ground in a standby mode.

As illustrated in FIG. 2A, in the memory cell 200, a word line (wl) could be coupled to the gates of nFETs N3, N4 and the bit lines blt, blc could be coupled to an arm of nFETs N3, N4, respectively. Further, a body bias generator 210 may be coupled to the back-gates of nFETs N1, N2, N3 and N4 in the memory cell 200. (It should be noted that the body bias generator 210 may be used to generate a bias voltage for a plurality of memory cells 200. That is, a body bias generator 210 need not be provided for every memory cell 200. It should also be noted that the pFETs P1, P2 may include back-gated pFETs which may be biased appropriately for achieving good performance and stability.

In addition, a similar scheme (e.g., as that illustrated in FIG. 2A) could be used for stacked nFET devices to control the Vt of an nFET in active and standby mode for a 4-T cell and an 8-T cell.

Figure 2B:
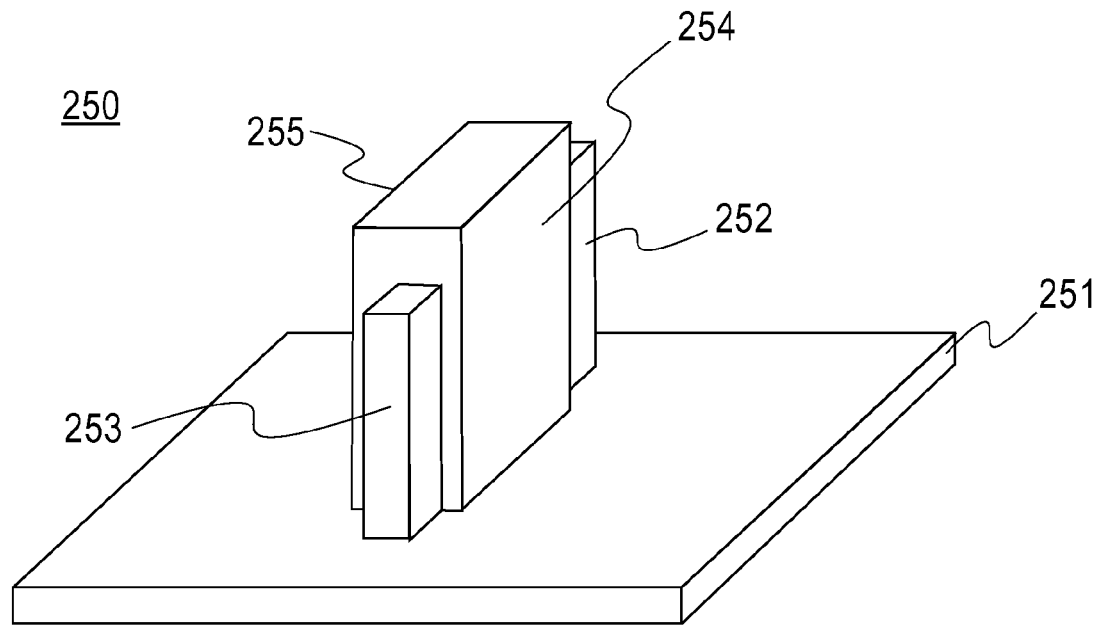
FIGS. 2B-2C illustrate a double-gate transistor and a trigate transistor (e.g., three-gated transistor) 295, which may be used in the memory cell 200 according to the exemplary aspects of the present invention.
Figure 2C:
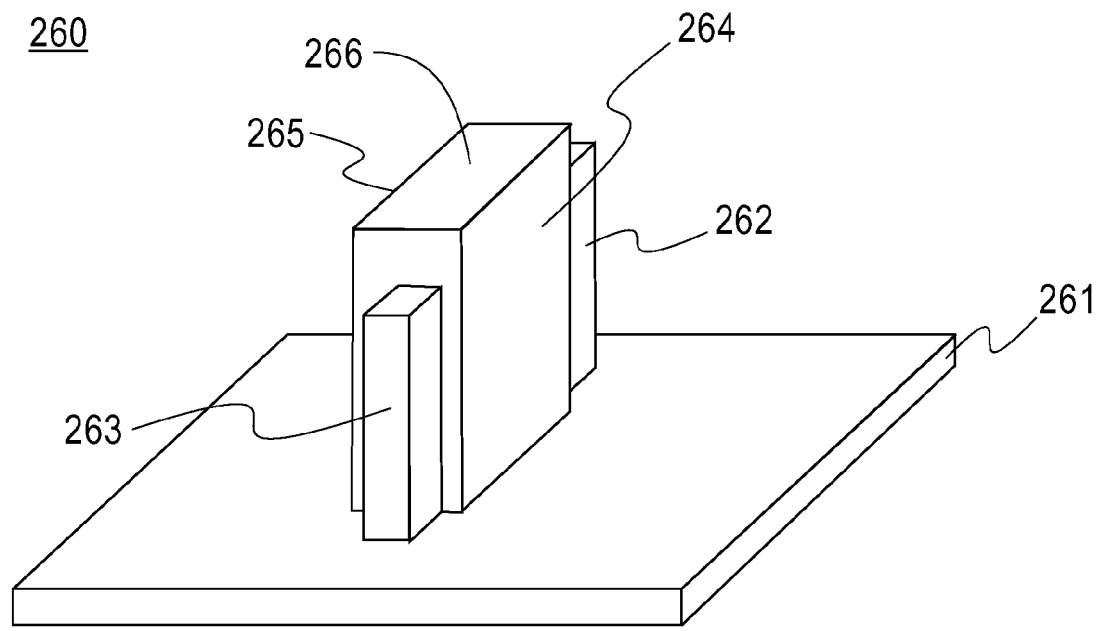

FIGS. 2B-2C illustrate a double-gate transistor 250 and a trigate transistor (e.g., a three gated transistor) 260, which may be used in the memory cell 200 according to the exemplary aspects of the present invention. As illustrated in FIG. 2B, the double-gate transistor 250 (e.g., a finFET double-gate transistor) may include a substrate 251 (e.g., silicon, silicon-on-insulator (SOI), oxide, etc.), source 252, drain 253, front gate 254 and back-gate 255. A common mode of operation of the double-gate FET is to switch the gates simultaneously.

Another use of the two gates (e.g., three-gates) is to switch only one gate and apply a bias (e.g., a back-gate bias) to the second gate to dynamically alter the threshold voltage of the FET, in which case the double-gate FET may be described as a "back-gated FET" or "back-gate biased FET". Similarly, the gates of the trigate transistor may be switched simultaneously or one of the gates may be biased in which case the trigate transistor may be described as a "back-gated FET" or "back-gate biased FET". (It should be noted that a "double-gate" device may be defined as a device having two inversion channels (e.g., located on opposite sides of a finFET).

The channel region in the transistor 250 may include a fin-shaped bar of silicon, and the gates (e.g., front and back-gates 254, 255) may be wrapped around the silicon bar. The channel may therefore be controlled using the front and back-gates 254, 255.

As illustrated in FIG. 2C, the trigate transistor 260 may have a design similar to that of the double-gate transistor 250 (e.g., including a substrate 261 (e.g., silicon, silicon-on-insulator (SOI), oxide, etc.), source 262, drain 263, front gate 264 and back-gate 265), but the transistor 260 also includes a top gate 266 which may also be used to control the channel.

In one exemplary embodiment, for example, the nFETs (e.g., N1-N4) may be split gate finFETs (e.g., back-gated split gate finFETs) and the pFETs (e.g., P1-P2) may be trigate transistors. In another exemplary embodiment, the nFETs (e.g., N1-N4) and pFETs (e.g., P1-P2) may be trigate FETs, the nFETs (e.g., back-gated trigate nFETs) being gated by a gate electrode formed below a body of the trigate FETs.

According to the exemplary aspects of the present invention, the memory cell 200 may include a semiconductor SRAM which includes at least one double-gate device with coupled back-gates with asymmetrical gates. The SRAM may include, for example, an SRAM finFET device structure where a pFET operates in double-gate symmetrical mode and the nFETs (e.g., at least one nFET) include asymmetrical double-gates.

The SRAM may also include an SRAM finFET asymmetrical back-gate structure with stacked nFETs. In addition, the SRAM back-gate bias can exceed the supply voltage in an active mode while it can be reduced below ground.

Figure 3A:
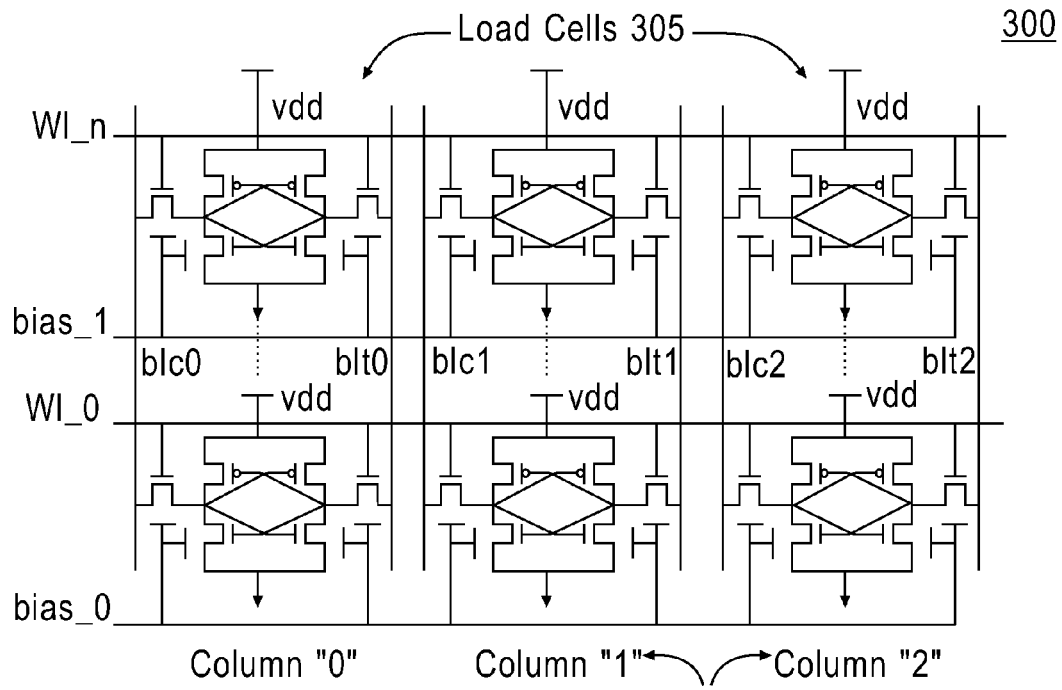
FIGS. 3A-3C illustrate different biasing techniques which may be used according to the exemplary aspects of the present invention.
Figure 3B:
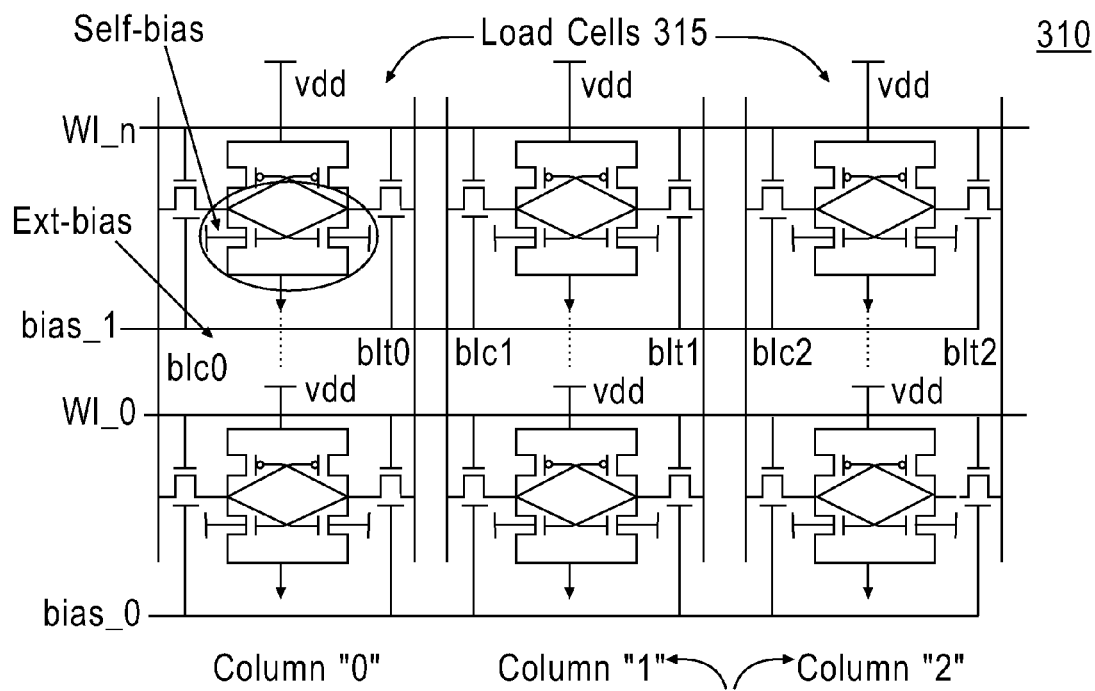
Figure 3C:
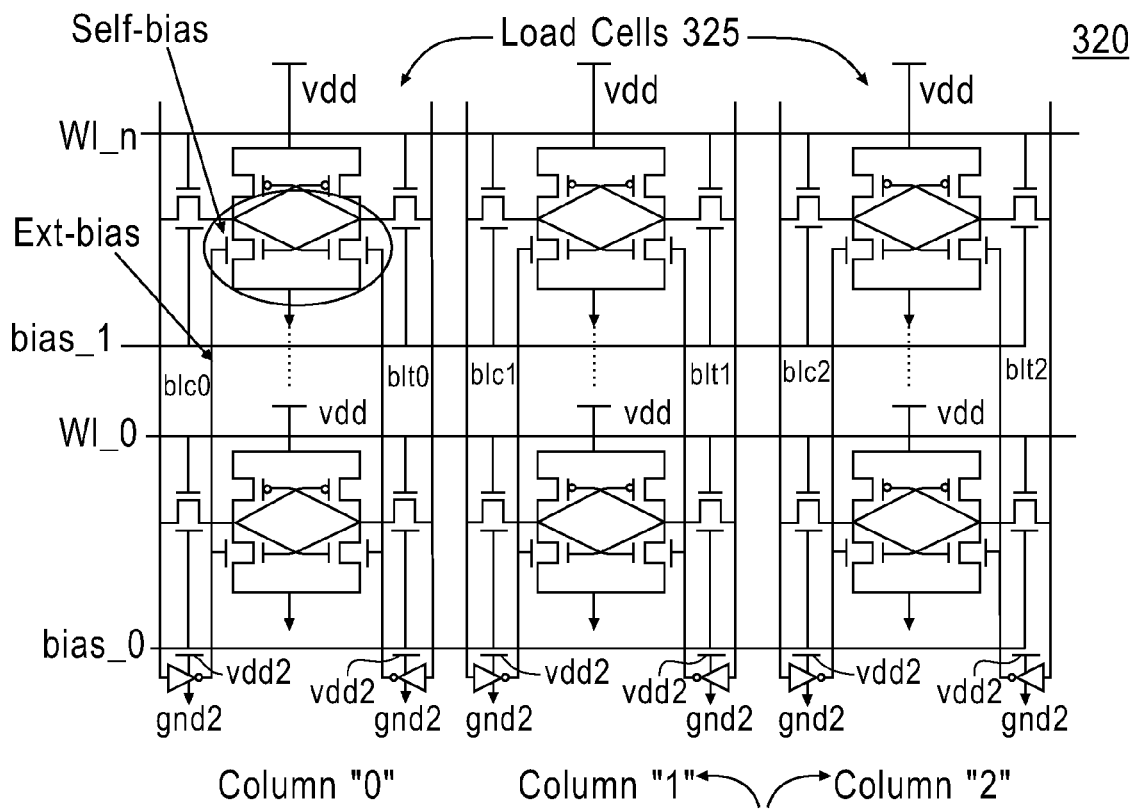

FIGS. 3A-3C illustrate different biasing techniques which may be used according to the exemplary aspects of the present invention. Specifically, FIG. 3A illustrates a memory device 300 having finFETs with external back-gate biasing, FIG. 3B illustrates a memory device 310 having finFETs with internal biasing (e.g., self-biasing) and external biasing, also referred to as mixed-mode back-gate biasing (e.g., internal and external back-gate biasing). FIG. 3C illustrates another example of a memory device 320 having finFETs with mixed-mode back-gate biasing, according to the exemplary aspects of the present invention.

As illustrated in FIGS. 3A-3C, the cells included in the devices 300, 310, 320 (e.g., load cells 305, 315 and 325) may include the memory cell (e.g., memory cell 200) according to the exemplary aspects of the present invention. (For simplicity, the notation for the FETs (e.g., pFETs P1, P2, and nFETs N1-N4) used in FIG. 2A, may be similarly used to describe the FETs illustrated in FIGS. 3A-3C).

As illustrated in FIG. 3A, the biasing of pass gate devices (e.g., N3, N4) and pull down devices (e.g., N1, N2) may be achieved using an external control signal. That is, when the wordline (e.g., Wl_n) goes high then the devices (e.g., N1-N4) are biased high decreasing the Vt of the devices, making them stronger. When the wordline is inactive, the biases for the devices (e.g., N1-N4) are "0" or "gnd" making the devices weak and less leaky.

FIG. 3B illustrates a mixed mode bias. That is, pull down devices (e.g., N1, N2) are self biased (e.g., gate input (from the internal node) drives the back-gate of the pull down). There is no need for external biasing with this arrangement. The back-gate of the passgate (e.g., N3, N4) is driven by the external signal activated by the wordline.

In the aspect illustrated in FIG. 3C, pass gate back biasing is done externally similar to FIG. 3B while pull down device back-gate is driven by the inverted bitlines. That is, during standby mode, bitlines are pre-charged high and the bias to the pull down is "0". However, when "0" is to be read then the pull down back-gate bias is "high" due to inverted bitline signal. This helps in reading or writing the data. The inverter used on the bitline can be supplied with higher vdd (vdd2) and lower gnd (gnd2).

In another embodiment, (e.g., a fully self-biased state which is not shown in FIGS. 3A-3C) the inverted bitline signal also drives the pass gate along with pull down.

It should be noted that the embodiments illustrated in FIGS. 3A-3C are merely illustrative and should not be considered limiting. That is, other embodiments are also possible.

Figure 3D:
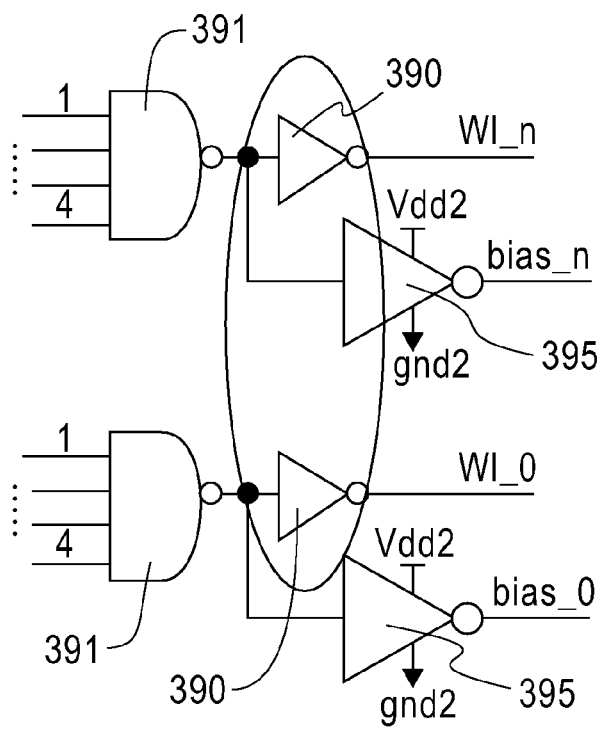
FIG. 3D illustrates an example of external biasing in the memory cell according to the exemplary aspects of the present invention.

Further, FIG. 3D further illustrates an example of external biasing in the memory cell according to the exemplary aspects of the present invention. That is, FIG. 3D illustrates an exemplary configuration for bias generation in a memory cell according to the present invention.

As illustrated in FIG. 3D, a bias generator 395 may be used to generate a bias voltage for the memory cell according to the exemplary aspects of the present invention. The external bias (e.g., bias_0 . . . bias_n) in the memory cell may be derived from a prior stage of a wordline driver 390 (e.g., and NAND gates 391 receiving pre-decoded addresses 1-4). The drivers can have VDD2 (power) and gnd2 (ground). Gnd2 may be lower than gnd and Vdd2 may be higher than VDD. This external bias may be used to drive the back-gates of the devices illustrated in FIGS. 3A-3C).

In short, the exemplary aspects of the present invention may provide a novel back-gate biasing scheme for stacked devices in an SRAM cell.

Referring again to FIG. 2A, the memory cell 200 may include a novel 6T (e.g., six transistor) SRAM with double-gate FETs. Specifically, FIG. 2A illustrates a larger-than-Vdd back-gate biasing scheme with asymmetrical (n+/p+) double-gate (DG) devices.

In the memory cell 200, the pFETs P1, P2 may be operating in double-gate mode. Further, control of Vt for four (4) nFETs by a back-gate biasing scheme by asymmetrical gates (e.g., n+/p+ polysilicon gates) may yield faster delays by forward body bias (FBB) and lower power by reverse body bias (RBB).

It should be noted that for double-gate (DG) devices, while there may be no benefit for a digital back-gate biasing (DBGB) scheme (e.g., Vgb (gate to body voltage)=VDD), or a lower-than DBGB scheme, a larger-thanVDD biasing may improve the performance and reduce a leakage current.

As noted above, the body bias generator 210 for generating a bias voltage in the memory cell 200 may be derived through one stage before the wordline driver. Thus, it may set up the bias before a "read" operation or "write" operation for an active mode (e.g., bias≧Vdd). In addition, during a standby, the bias may be reduced to "0" or below "0".

Figure 4:
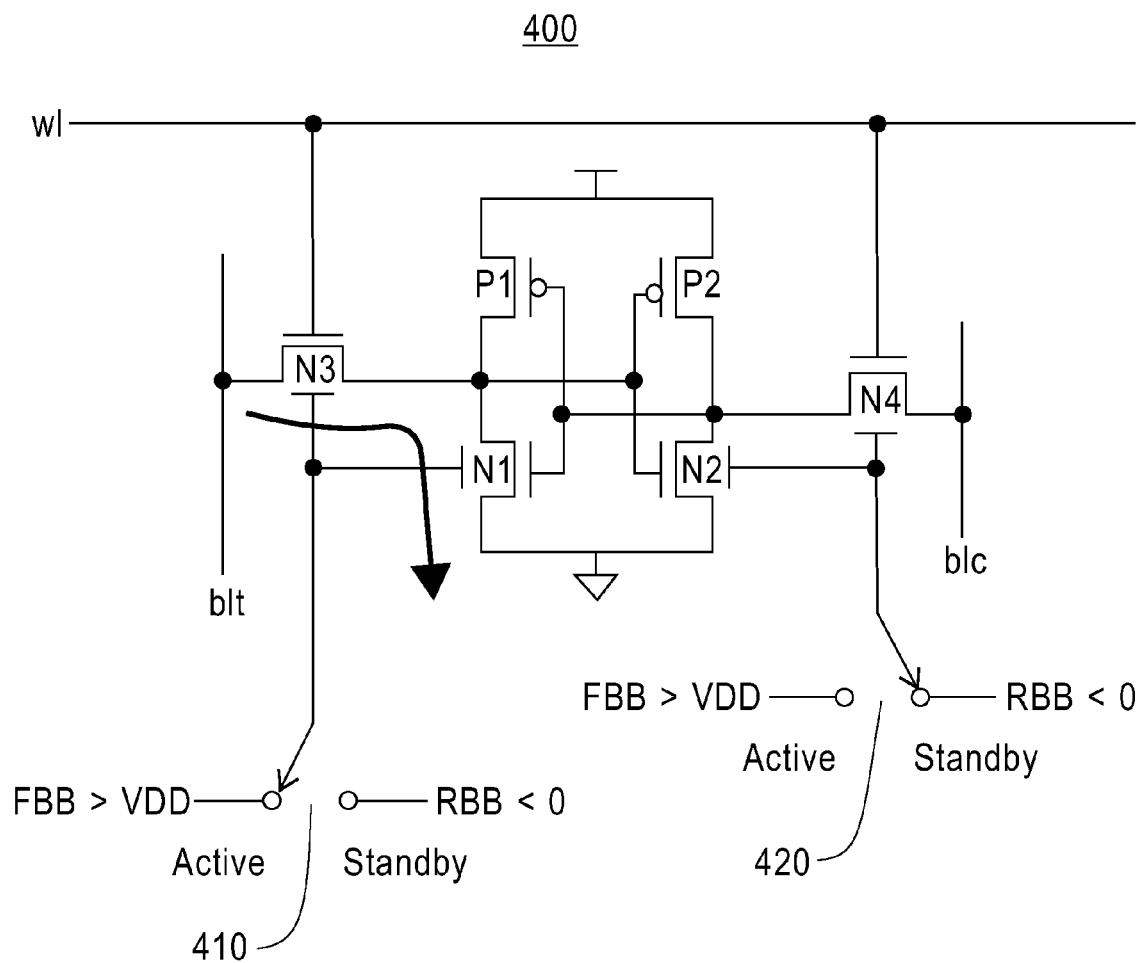
FIG. 4 provides another circuit diagram illustrating another example of a memory cell 400 (e.g., 6T SRAM with double-gate FETs) according the exemplary aspects of the present invention.

FIG. 4 provides another circuit diagram illustrating another example of a memory cell 400 (e.g., 6T SRAM with double-gate FETs) according the exemplary aspects of the present invention. A switch 410 may be coupled to a back-gate of nFETs N1, N3 which switches between active (e.g., FBB>VDD) and standby (e.g., RBB<0) modes, and a switch 420 may be coupled to a back-gate of nFETs N2, N4 which switches between active and standby modes. (It should be noted that the switches 410, 420 illustrated in FIG. 4 may be used for switching a bias voltage to a plurality of memory cells 400. That is, switches 410, 420 need not be provided for every memory cell 400.)

In the memory cell 400, the double-gate (DG) mode may perform better than single gate (SG) mode, but larger-than-VDD may speed up the circuit and reduce the power due to aggressive Vt modulation.

The present invention may provide larger-than-VDD back-gate biasing for an asymmetrical double-gate (DG). In this case, only one channel (e.g., about two times higher than that of bulk) may be used, resulting in a high performance. Further, the back-gate may effectively modulate Vt, yielding higher Ion (e.g., "on" current) by FBB but lower Ioff (e.g., "off" current) by RBB. In addition, there may be a negligible Igate (e.g., gate current) for a p+ polysilicon gate at FBB due to a lower field and a higher potential barrier.

Further, a symmetrical DG turns ON when one of gates is ON. This may not be applicable due to a leakage concern.

Further, for bulk-Si FETs with larger-than-VDD scheme, a triple-well process may be used. Thus, there may be an area penalty and process complexity. Specifically, for FBB, there may be an exponential increase in junction diode current, which may fight against the linearly-increased Ion, causing a slowing down of charging/discharging. Further, increasing junction capacitance (Cj) may cause a degraded speed. Further, there may be a degraded sub-threshold swing (S) due to the reduced depletion width (td).

Further, for RBB, band-to-band tunneling current may be increased and gate-induced drain leakage (GIDL) may occur for |bias voltage (Vbs)|>30% VDD. Further, the device may be less efficient in shorter gate lengths (L) due to a lower body factor for lower Vt, worsening short channel effects (SCEs).

Figure 5:
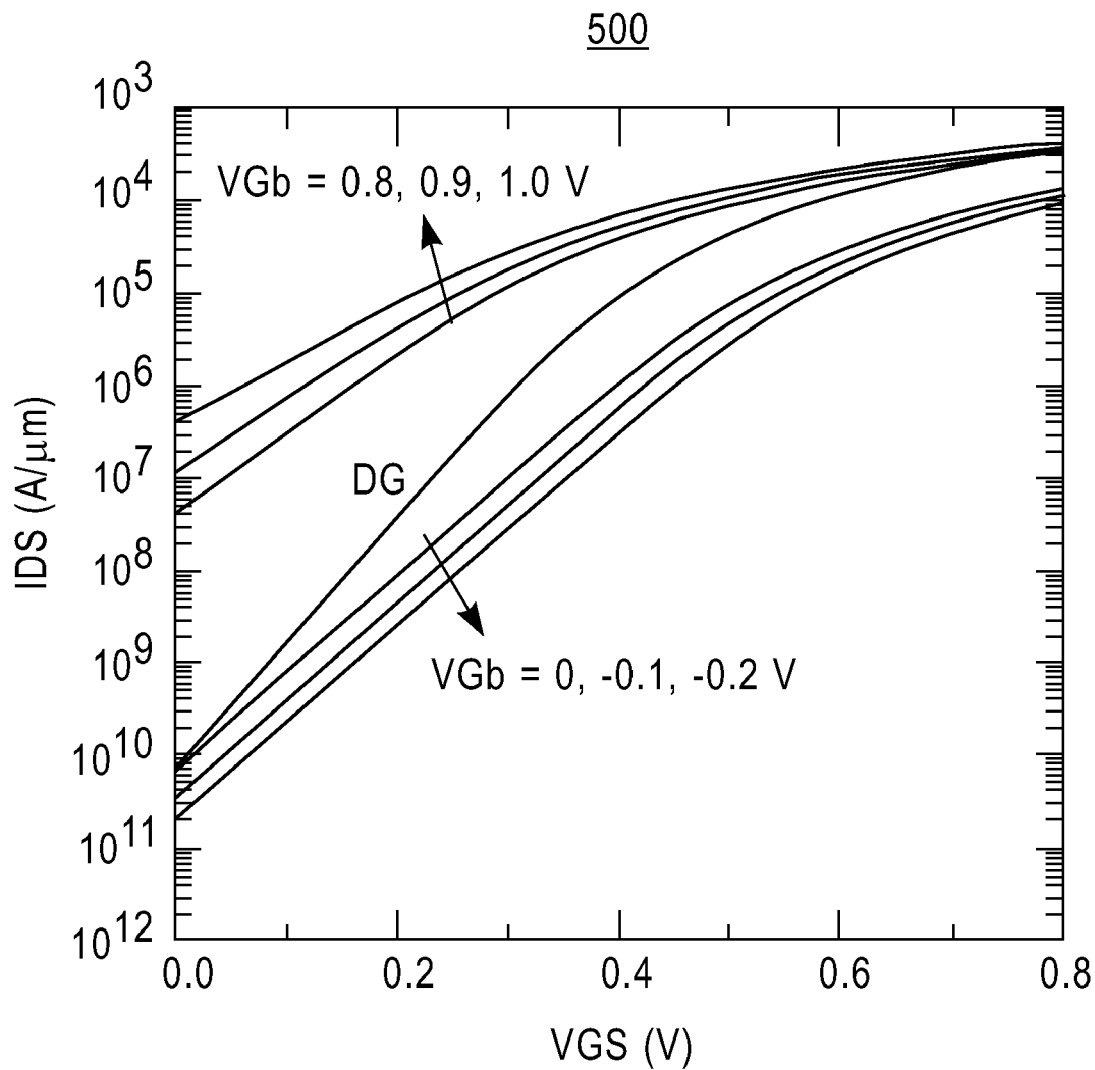
FIG. 5 provides a graph 500 illustrating an I-V simulation for a scheme (e.g., larger-than-VDD scheme)

Referring again to the drawings, FIG. 5 provides a graph 500 illustrating an I-V simulation for a scheme (e.g,. larger-than-VDD scheme). Specifically, the graph 500 illustrates a physics-based numerical simulation for 20 nm DG devices with back-gate biasing. As illustrated in FIG. 5, FBB (e.g., VGb (gate to body voltage)=0.8, 0.9, 1.0V) may result in Ion improvement. Further, RBB (e.g., VGb=0, −0.1, −0.2 V) may result in Ioff reduction, but due to the difficulty of lower-than-GND, GND could be used.

FIGS. 6A-6B provide graphs 600, 610, illustrating Ion and Ioff simulation for the scheme (e.g., a larger-than-VDD scheme), respectively. As illustrated in FIGS. 6A-6B, for DG devices with back-gate biasing, FBB with 0.2 V-larger-than VDD may result in about 25% improvement of Ion, and RBB with −0.2V may result in more than a 3× (e.g., three times) reduction of Ioff. Further, 20-40% faster read delays for 6T SRAM may be realized for 0.1-0.2 V-larger-than-VDD FBB scheme by physics-based numerical simulation.

Figure 7:
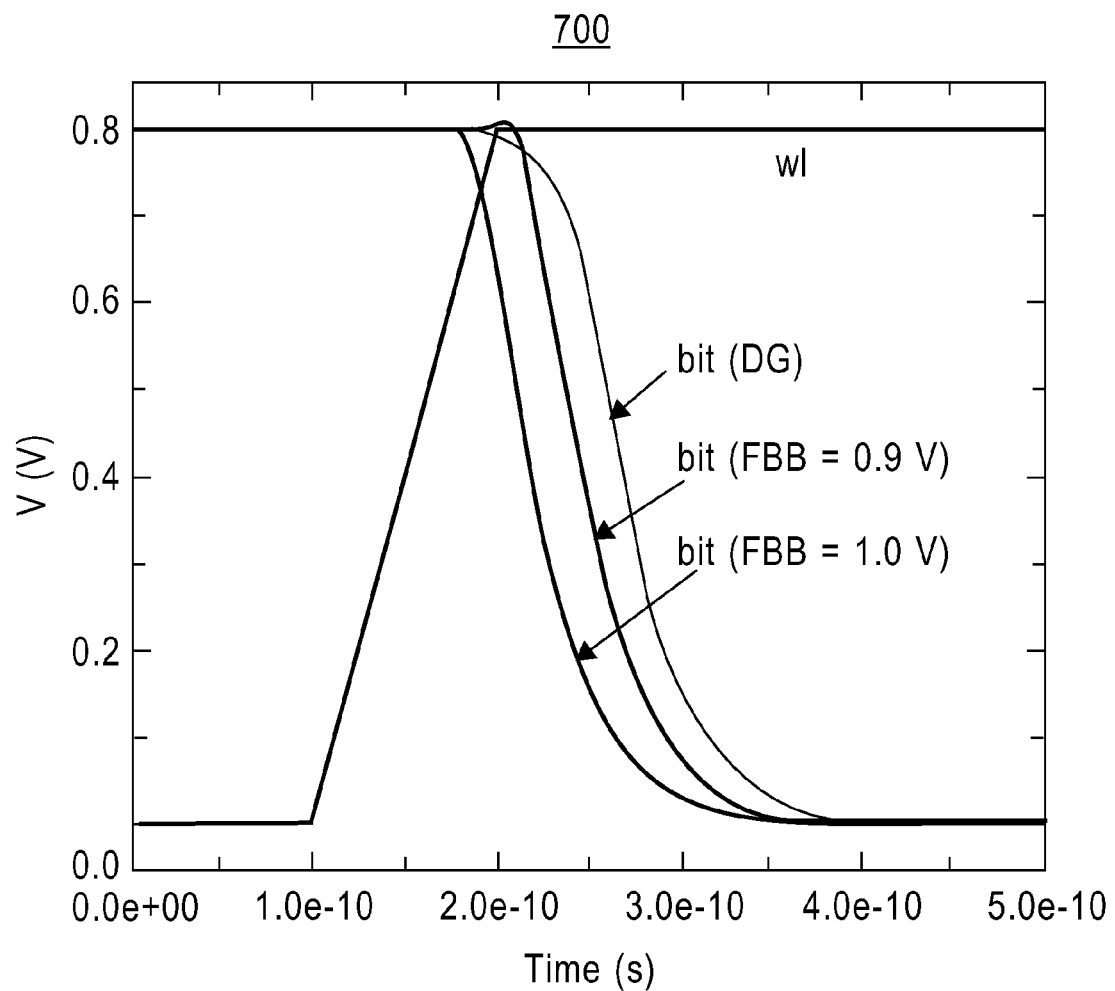
FIG. 7 provides a graph 700 illustrating a simulation of a read performance for a memory cell (e.g., 6T SRAM) according to the present invention.

FIG. 7 provides a graph 700 illustrating a simulation of a read performance for a memory cell (e.g., 6T SRAM) according to the present invention. As illustrated in FIG. 7, 20% to 40% faster read delays for 6T SRAM may be predicted for 0.1 to 0.2 V-larger than VDD FBB scheme by physics-based numerical simulation.

Figure 8:
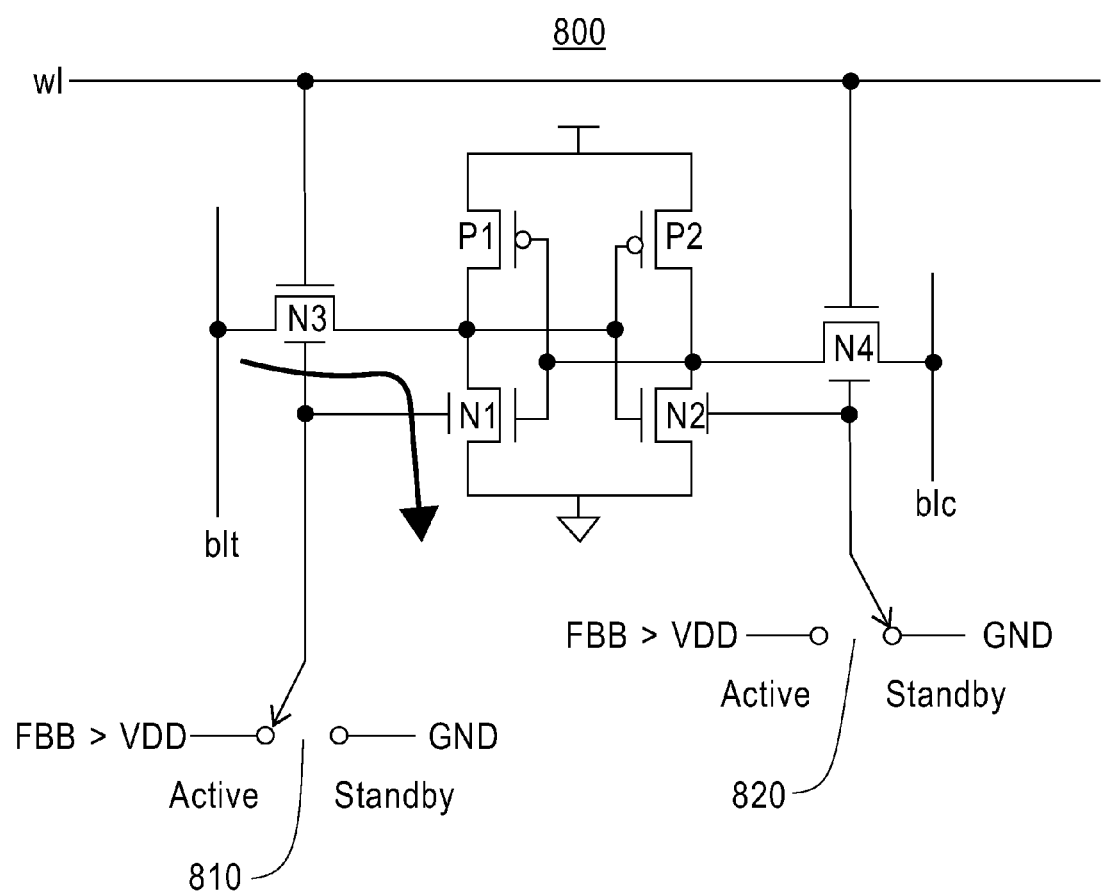
FIG. 8 is a circuit diagram illustrating a memory cell 800 which is a practical application of the scheme (e.g., larger-than-VDD scheme) according to the exemplary aspects of the present invention.

FIG. 8 is a circuit diagram illustrating a memory cell 800 which is a practical application of a scheme (e.g., larger-than-VDD scheme) according to the exemplary aspects of the present invention. Due to the process difficulty of the negative bias generator, FBB (e.g., only FBB) could be used to improve the circuit performance (e.g., without increasing a leakage power). As illustrated in FIG. 8, the memory cell 800 according to the exemplary aspects of the present invention may include a switch 810 coupled to a back-gate of nFETs N1, N3 and switching between active (e.g., FBB>VDD) and standby (e.g., gnd) modes, and a switch 820 coupled to a back-gate of nFETs N2, N4 and switching between active and standby modes.

Further, FIGS. 3A-3C illustrate different biasing techniques (e.g., external back-gate biasing and mixed-mode back-gate biasing) which are practical applications of a scheme (e.g., larger-than-VDD scheme) according to the exemplary aspects of the present invention.

Figure 9:
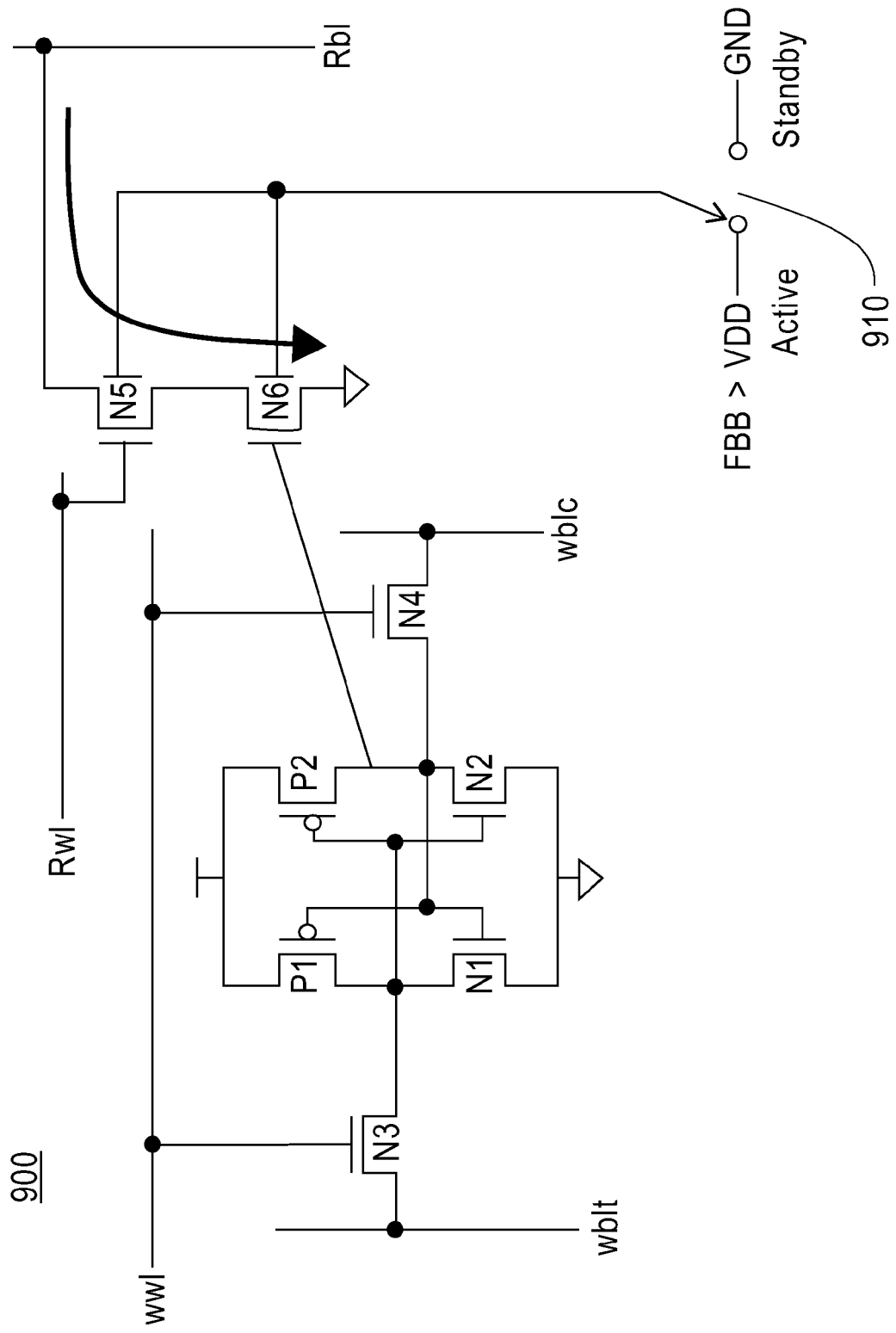
FIG. 9 is a circuit diagram illustrating a memory cell 900 which may show the broad applicability of the scheme (e.g., larger-than-VDD scheme) according to the exemplary aspects of the present invention.

FIG. 9 is a circuit diagram illustrating a memory cell 900 which may show the broad applicability of the scheme (e.g., larger-than-VDD scheme) according to the exemplary aspects of the present invention. Specifically, the scheme may be used, for example, for 4T, 8T and 6T SRAM cells. FIG. 9, for example, illustrates a memory cell 900 which is an 8T SRAM cell having nFETs N5, N6 having back-gates coupled to a switch 910 switching between an active mode (e.g., FBB>VDD) and a standby mode (e.g., GND). Further, the gate of nFET N5 is coupled to the read word line Rwl, and the gate of nFET N6 is coupled to an arm of pFET P2. It should be noted that the bold arrow in FIGS. 2, 4, 8 and 9 illustrates the current path from the bitline fully charged to Vdd when pulled down to "0".

Figure 10:
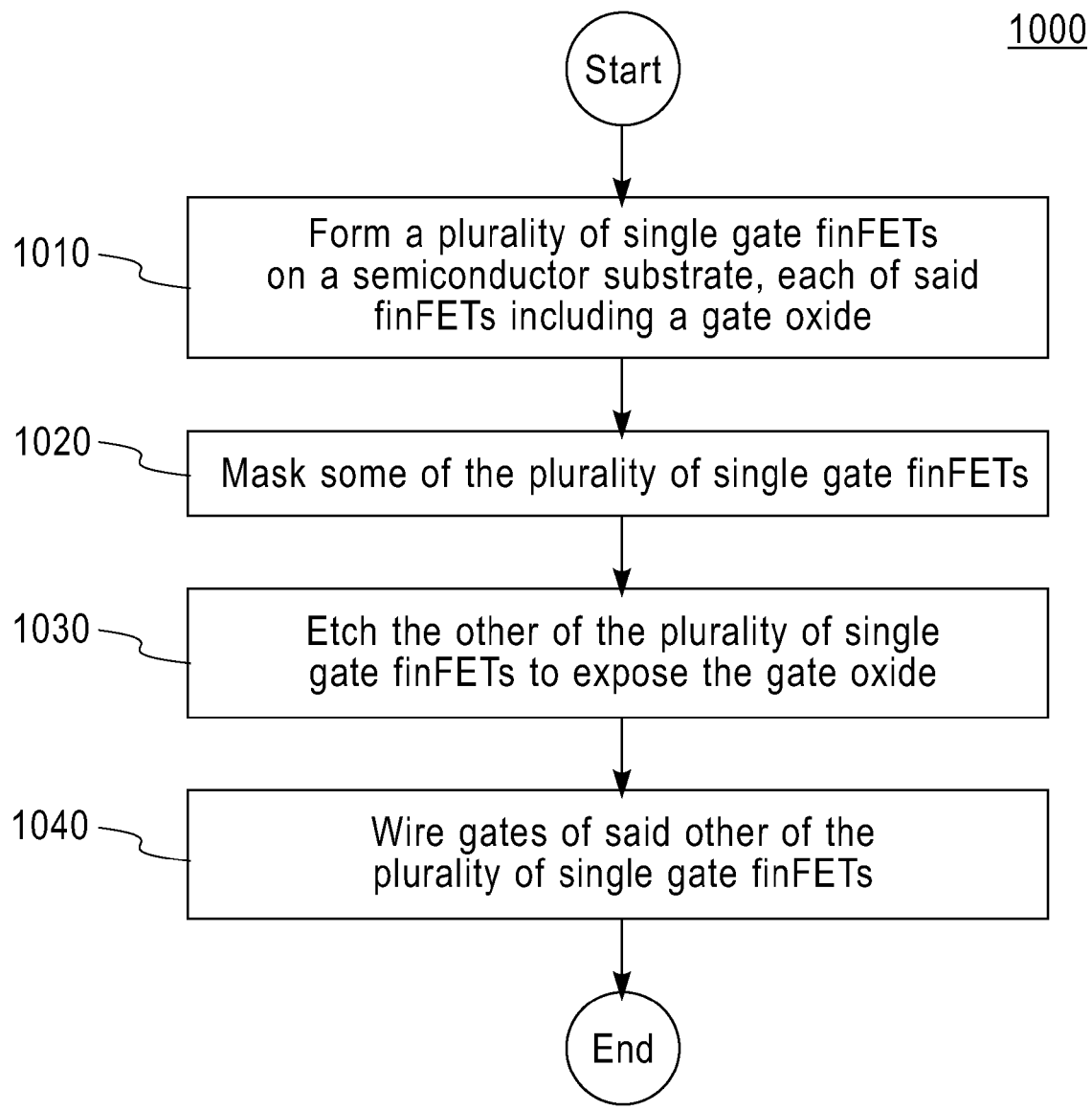
FIG. 10 illustrates a method 1000 of fabricating a memory cell (e.g., a 6T SRAM cell utilizing double-gate finFETs) according to the exemplary aspects of the present invention.

FIG. 10 illustrates a method 1000 of fabricating a memory cell (e.g., a 6T SRAM cell utilizing double-gate finFETs) according to the exemplary aspects of the present invention. As illustrated in FIG. 10, the method 1000 includes forming (1010) a plurality of single gate finFETs on a semiconductor substrate, each of the finFETs including a gate oxide, masking (1020) some (e.g., a first portion) of the plurality of single gate finFETs, etching (1030) the other (e.g., a second portion) of the plurality of single gate finFETs to expose the gate oxide, and wiring (1040) the gates of the other of the plurality of single gate finFETs. (It should be noted that a "single gate" device may be construed to include a device with two channels (or three channels in the case of the trigate transistor) and a single piece of polysilicon.)

Figure 11A:
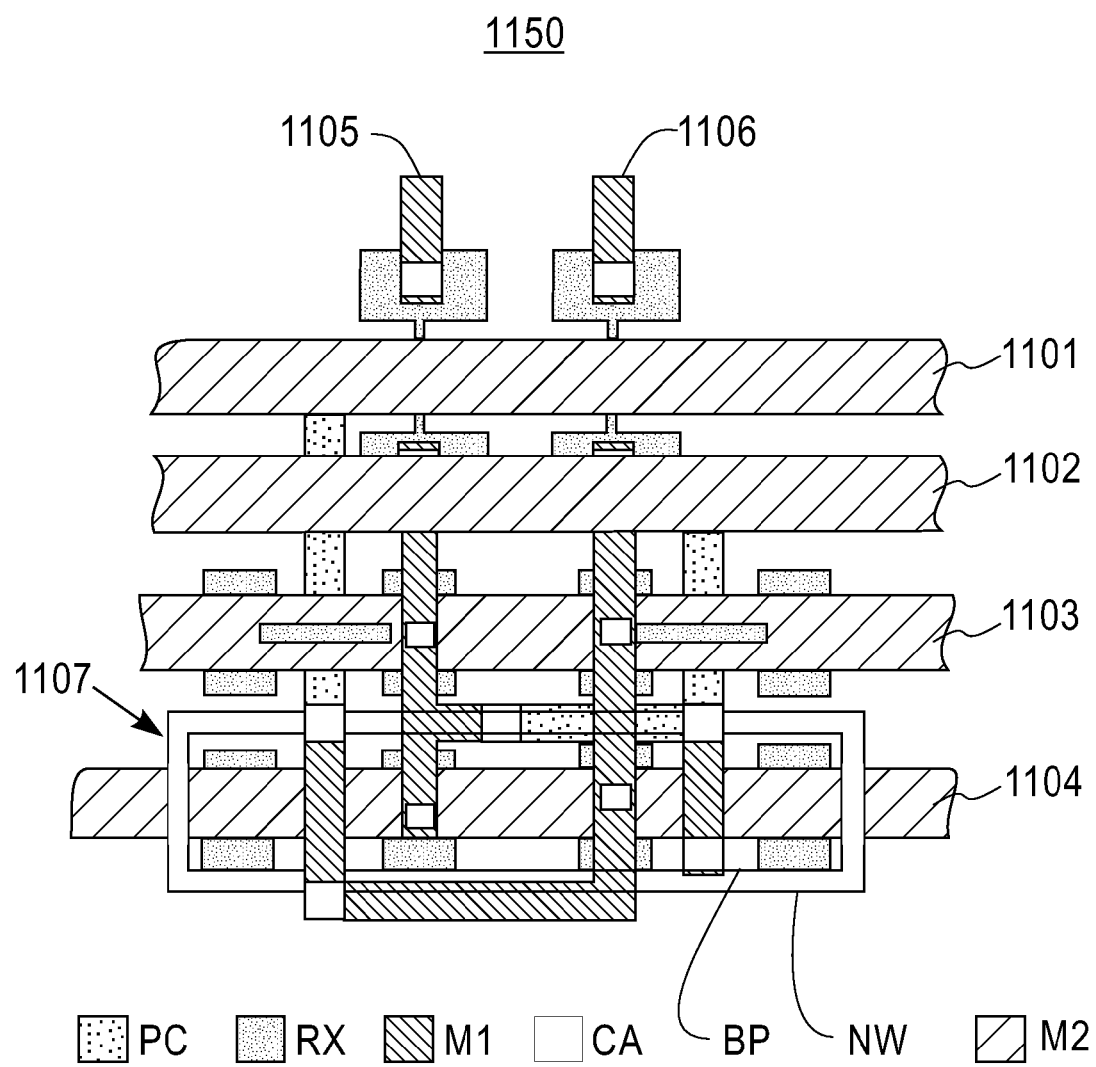
FIGS. 11A-11B illustrate exemplary layouts (e.g., plan views) for a memory cell (e.g., a 6T SRAM cell utilizing double-gate finFETs) according to the exemplary aspects of the present invention.
Figure 11B:
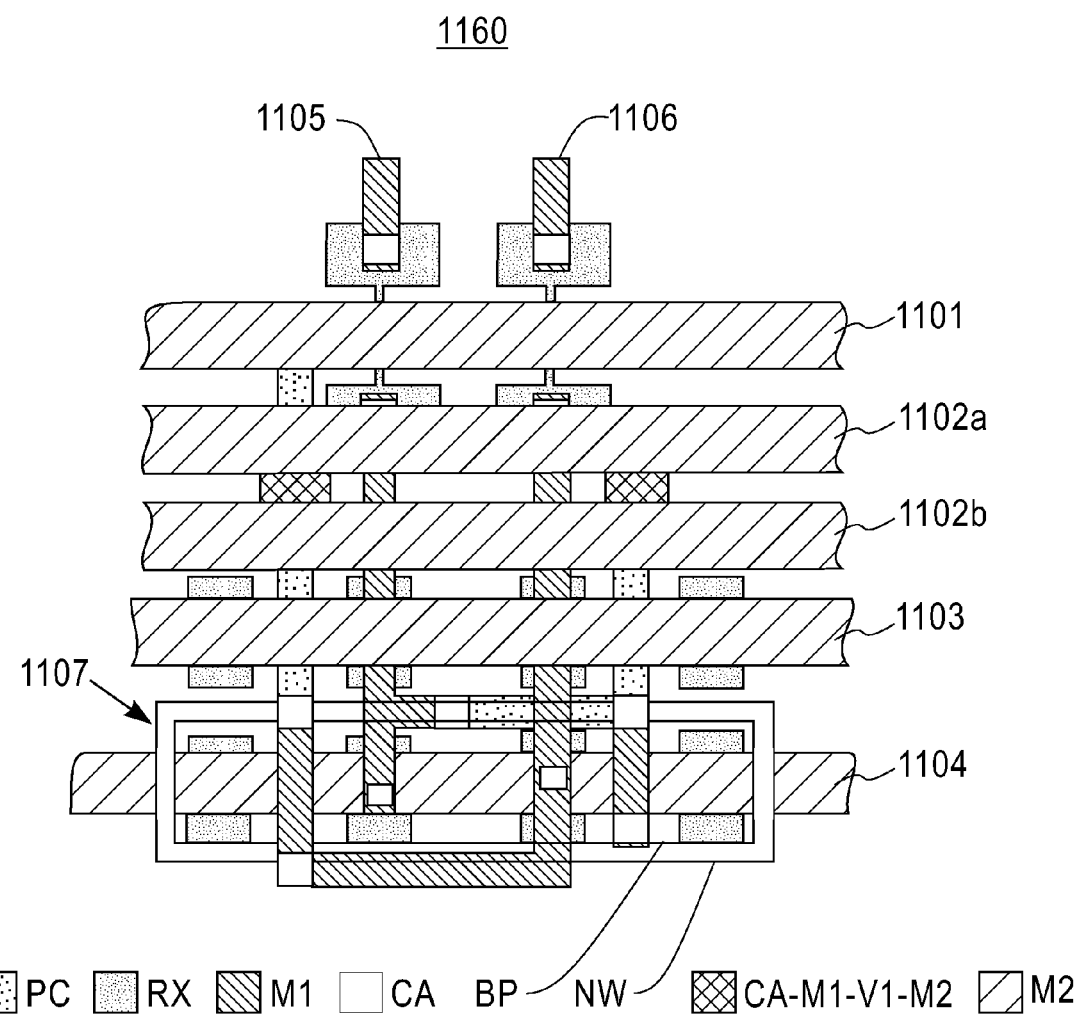

FIGS. 11A-11B illustrate exemplary layouts (e.g., plan views) for a memory cell (e.g., a 6T SRAM cell utilizing double-gate finFETs) according to the exemplary aspects of the present invention. Specifically, FIG. 11A illustrates an exemplary layout for a memory cell 1150 having a shared back-gate bias for transfer and pull-down devices. The memory cell 1150 includes wordline (W/L) 1101, back-gate bias 1102, ground (Gnd) 1103, and Vdd 1104. The cell 1150 also includes bit lines B/L 1105 and B/L(bar) 1106. FIG. 11A also illustrates pull-up devices 1107 having strapped front/back-gates.

FIG. 11B illustrates an exemplary layout for a memory cell 1160 having separate back-gate biases for transfer and pull-down devices. The memory cell 1160 includes wordline (W/L) 1101, transfer back-gate bias 1102a, pull down back-gate bias 1102b, ground (Gnd) 1103, and Vdd 1104. The cell 110 also includes bit lines B/L 1105 and B/L(bar) 1106. FIG. 11B also illustrates pull-up devices 1107 (e.g., pFETs) having strapped front/back-gates (It should also be noted that FIGS. 11A and 11B illustrate the devices 1107 (e.g., pFETs) with two gates that are strapped together which allows for one double-gate process with separate front and back gates to be used for several of the devices (e.g., all of the devices in the memory cell). In the mixed cases where separate and combined gates are used, there can be more process complexity.)

Figure 11C:
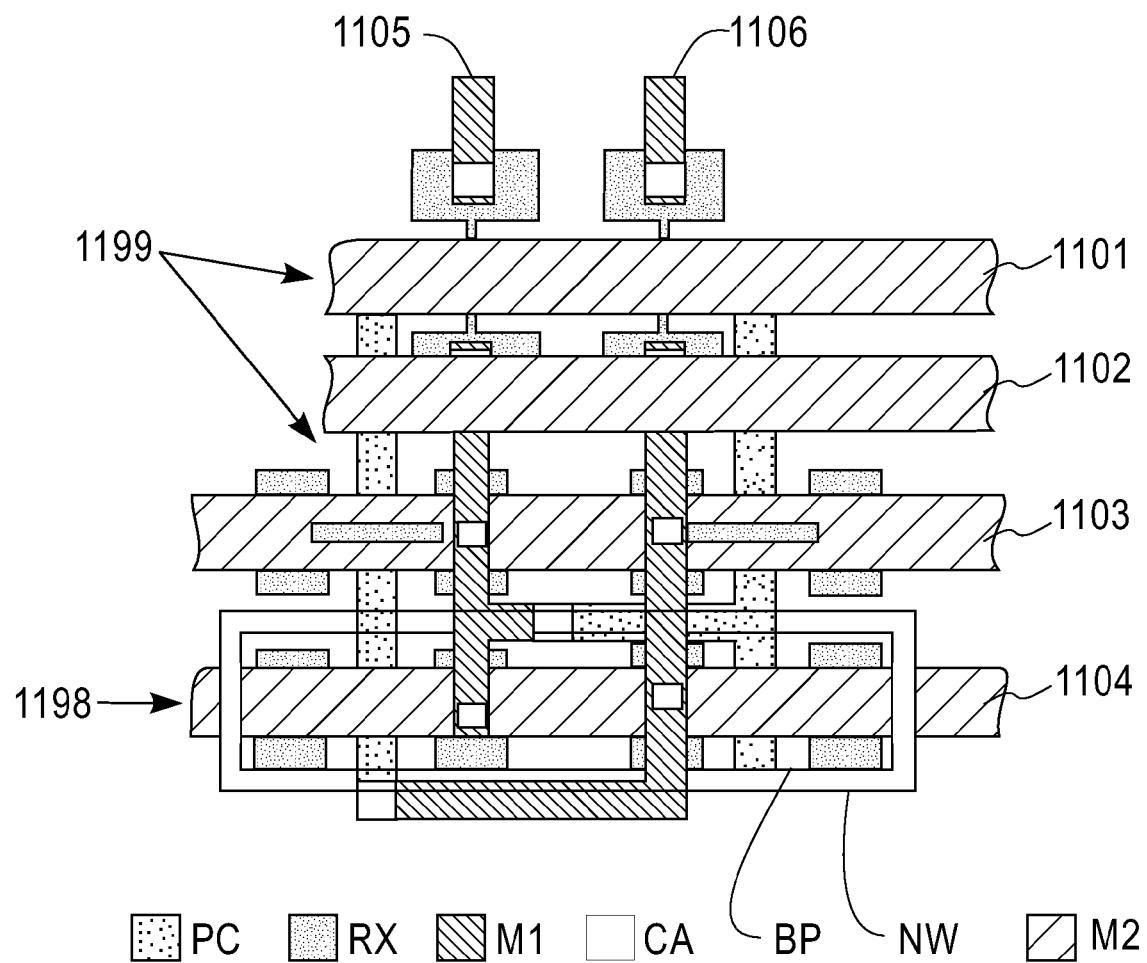
FIGS. 11C-11D illustrate exemplary layouts (e.g., plan views) for a memory cell (e.g., a 6T SRAM cell utilizing single gate finFETs 1150 and double-gate finFETs 1160) according to the exemplary aspects of the present invention.
Figure 11D:
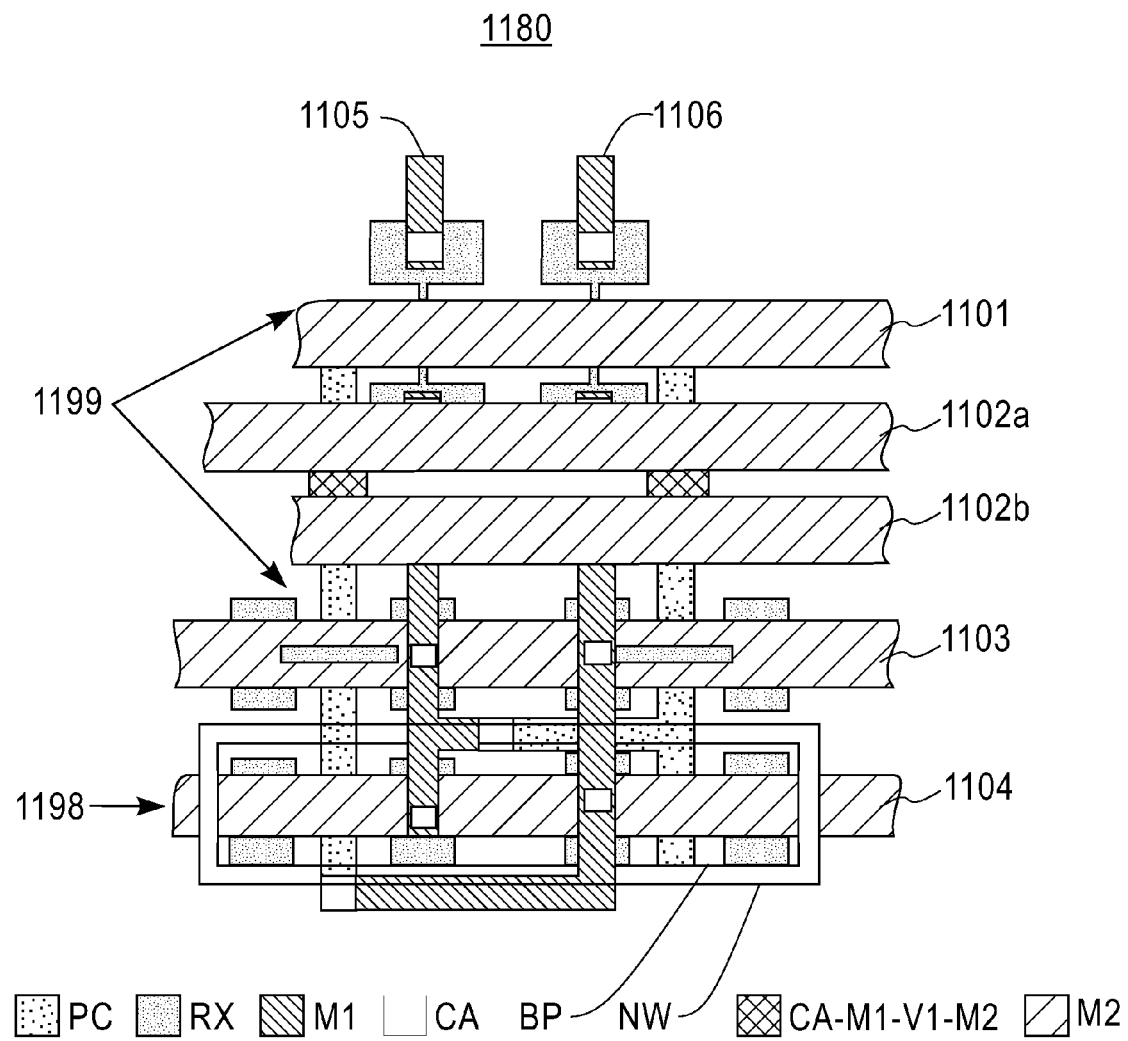

FIGS. 11C-11D illustrate exemplary layouts (e.g., plan views) for a memory cell (e.g., a 6T SRAM cell utilizing single gate finFETs 1198 and double-gate finFETs 1199) according to the exemplary aspects of the present invention. Specifically, FIG. 11C illustrates an exemplary layout for a memory cell 1170 having a shared back-gate bias for transfer and pull-down devices. The memory cell 1170 includes wordline (W/L) 1101, back-gate bias 1102, ground (Gnd) 1103, and Vdd 1104. The cell 1170 also includes bit lines B/L 1105 and B/L(bar) 1106.

FIG. 11D illustrates an exemplary layout for a memory cell 1180 having separate back-gate biases for transfer and pull-down devices. The memory cell 1180 includes wordline (W/L) 1101, transfer back-gate bias 1102a, pull down back-gate bias 1102b, ground (Gnd) 1103, and Vdd 1104. The cell 1170 also includes bit lines B/L 1105 and B/L(bar) 1106.

FIGS. 11A-11D also include a legend to help identify the features of the memory cell 1150. For example, in FIG. 11A, the wordline 1101, back-gate bias 1102, ground 1103 and Vdd 1104 may be formed by depositing metal M2, the bitlines 1105, 1106 may be formed by depositing metal M1, and so forth.

Further, the legend (e.g., polysilicon gate (PC), recessed oxide (RX), first metal layer (M1), contact (CA), block P (BP), N well (NW), upper level contact (V1) and second metal layer (M2), etc.) is included to illustrate an exemplary construction of the memory cell, but should not be considered limiting.

FIGS. 12A-12E further illustrate the method 1000 of fabricating a memory cell 1200 according to the exemplary aspects of the present invention. Specifically, FIGS. 12A-12E illustrate a method 1000 of fabricating a memory cell 1200 which includes single gate finFETs and double-gate finFETs.

Figure 12A:
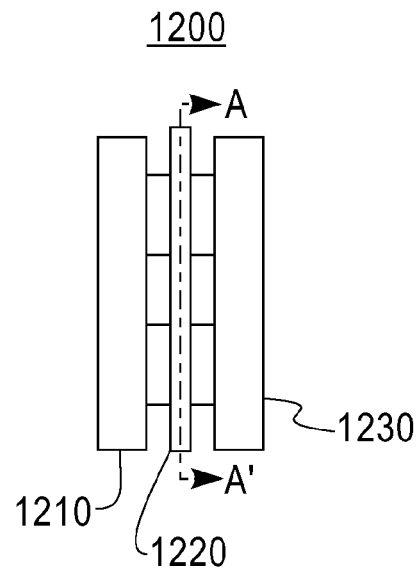
FIGS. 12A-12E further illustrate the method 1000 of fabricating a memory cell 1200 according to the exemplary aspects of the present invention.
Figure 12B:
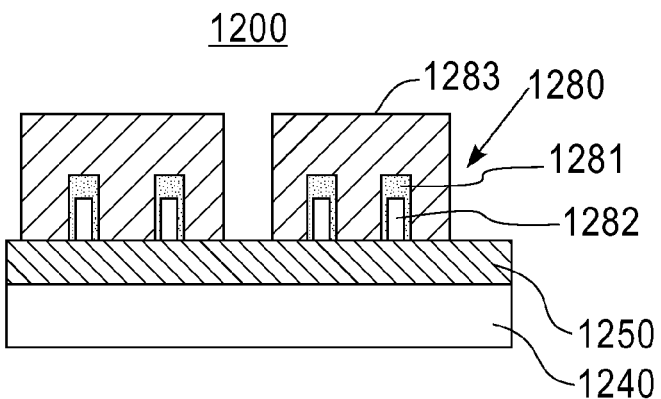

FIG. 12A is a plan view of the memory cell 1200 having source 1210, gate 1220 and drain 1230. FIG. 12B is a cross-sectional view (e.g., a view along the channel (the source/drain regions are into and out of the page) about line A-A' in FIG. 12A.

As noted above, in the method 1000, single gate finFETs may be formed using techniques (e.g., channels may be created by an sidewall image transfer (SIT) mask, diffusion mask, etc.). Fin spacing is not necessarily on any particular pitch. The memory cell 1200 may include a substrate (e.g., silicon) 1240, bulk oxide (e.g., silicon oxide) 1250, and a gate 1280 which includes a fin body 1282, a gate oxide (e.g., silicon oxide) 1281 and gate electrode (e.g., polysilicon) 1283.

Figure 12C:
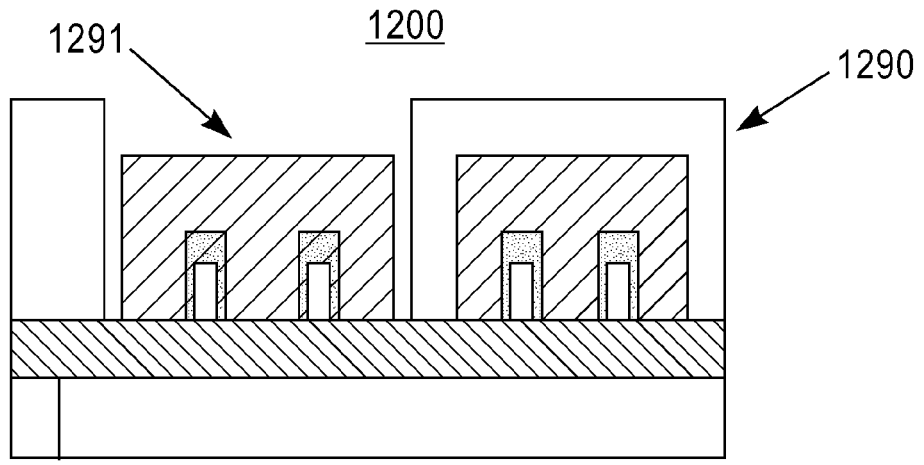

As illustrated in FIG. 12C, the method 1000 further includes applying a mask to fins that will become double-gate finFETs. Specifically, as illustrated in FIG. 12C, the resist (e.g., mask) 1290 may be applied, leaving a mask opening 1291.

Figure 12D:
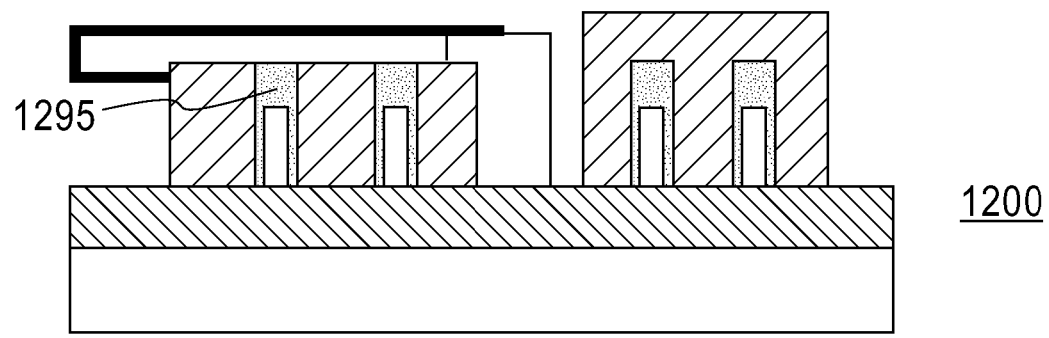

Further, as illustrated in FIG. 12D, the method 100 may further include etching (e.g., reactive ion etching (RIE) an exposed gate 1295 (e.g., endpoint on oxide). The resist (e.g., mask may also be removed.

Figure 12E:
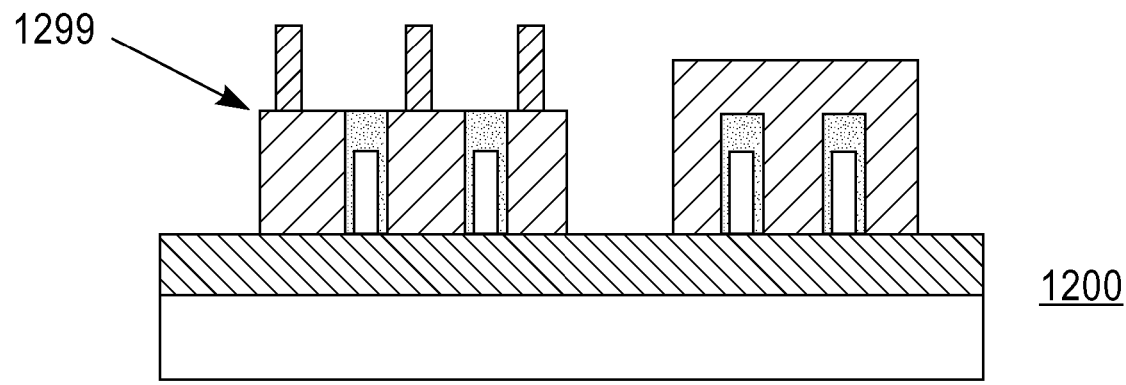

As illustrated in FIG. 12E, gates (e.g., separate gates) may be wired (e.g., using conventional wiring or sidewall image transfer (SIT) wiring). For example, FIG. 12E illustrates wires (e.g., SIT wires) 1299 which may be used to wire the gates in the memory cell. The formation of the wires (e.g., SIT wires) 1299 may be according to the process disclosed in IBM Docket No. BUR920040165US1 (U.S. patent application Ser. No. 10/907,971), which is commonly assigned with the present invention and incorporated by reference herein.

Figure 13A:
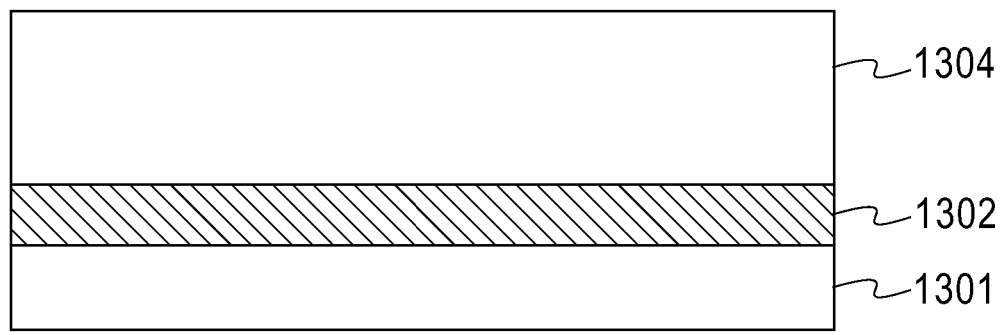
FIGS. 13A-13H illustrate a method 1400 of fabricating a memory cell according to another aspect of the present invention.
Figure 13B:
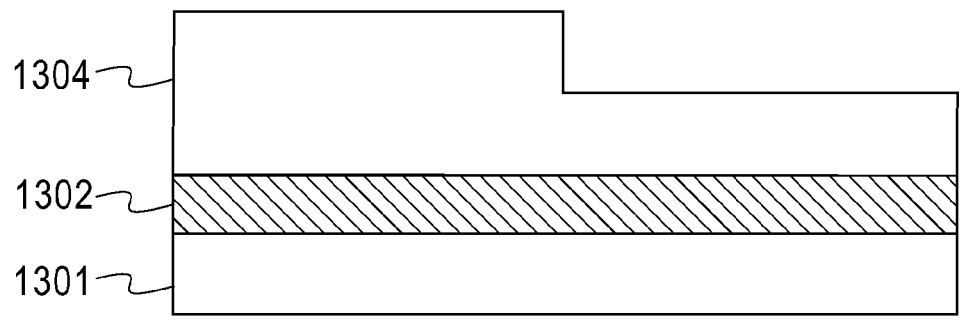
Figure 13C:
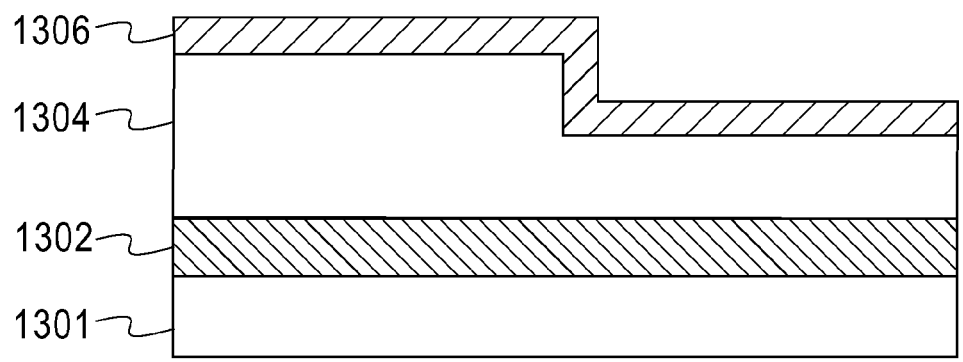

FIGS. 13A-13H illustrate a method 1300 of fabricating a memory cell according to another aspect of the present invention. Specifically, a layer of silicon 1304 may be formed on an insulator (e.g., silicon oxide formed on silicon 1301) 1302 to form an SOI wafer (FIG. 13A). A portion of the silicon layer 1304 may be patterned and thinned (e.g., using poly-buffered localized oxidation of silicon (e.g., LOCOS oxidation) and etch) (FIG. 13B). Conformal silicon dioxide 1306 may be deposited on the patterned layer 1304 (FIG. 13C).

Figure 13D:
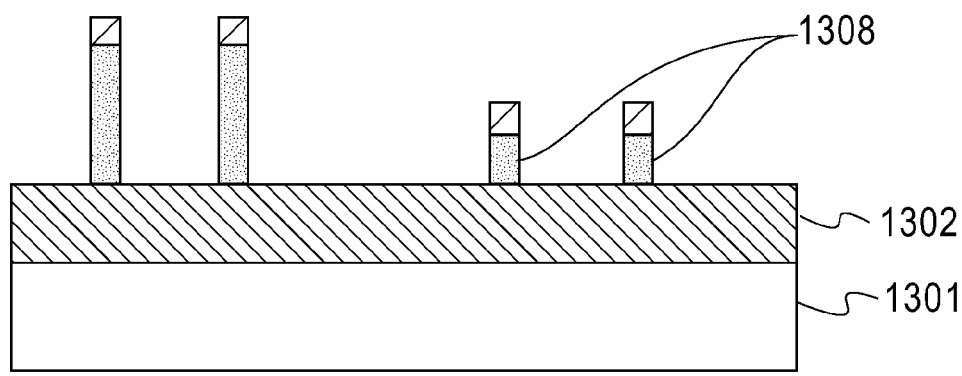
Figure 13E:
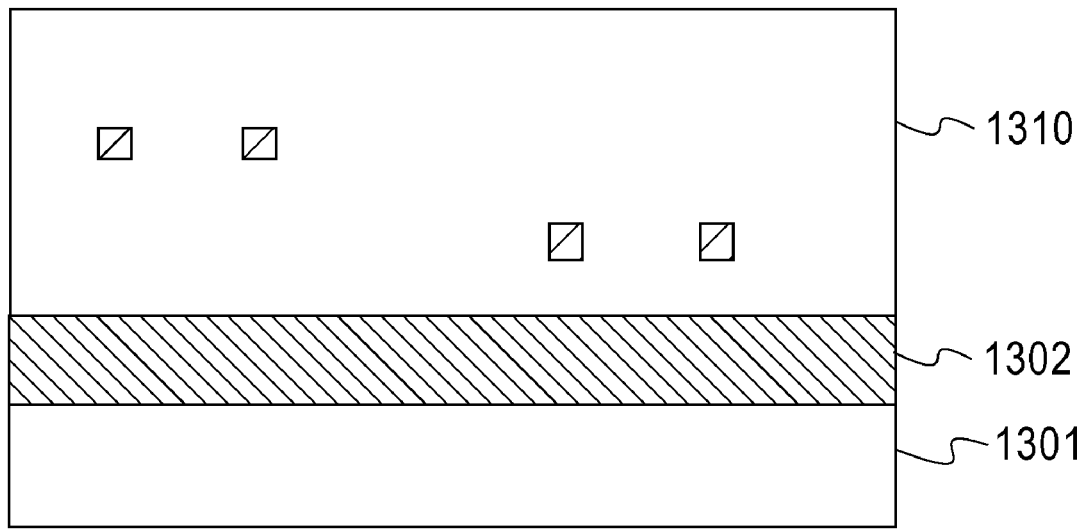
Figure 13F:
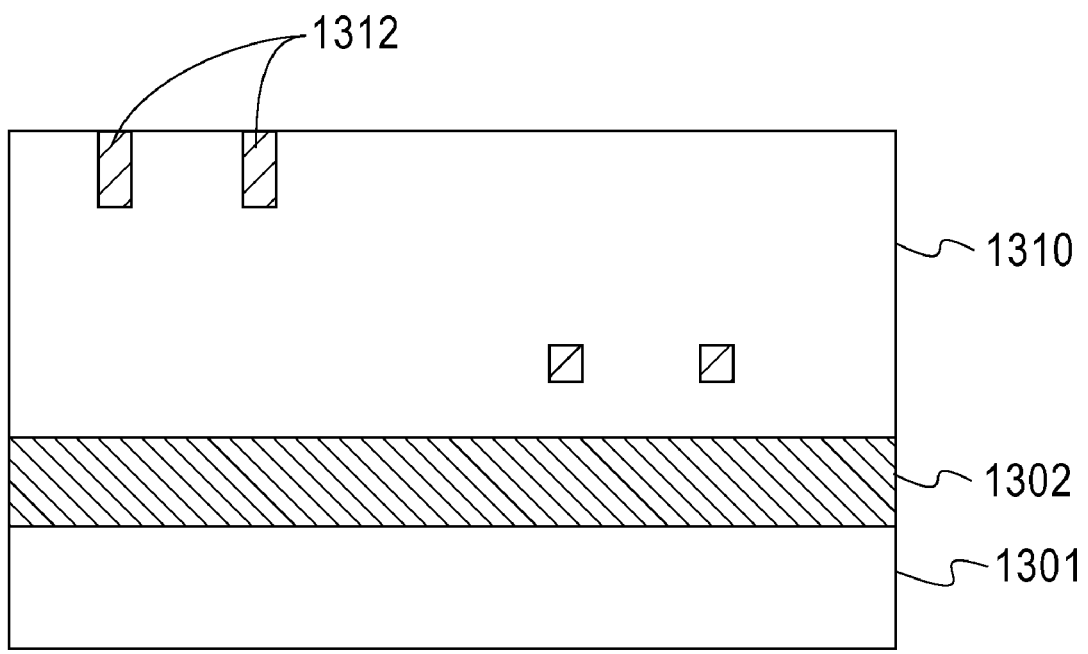
Figure 13G:
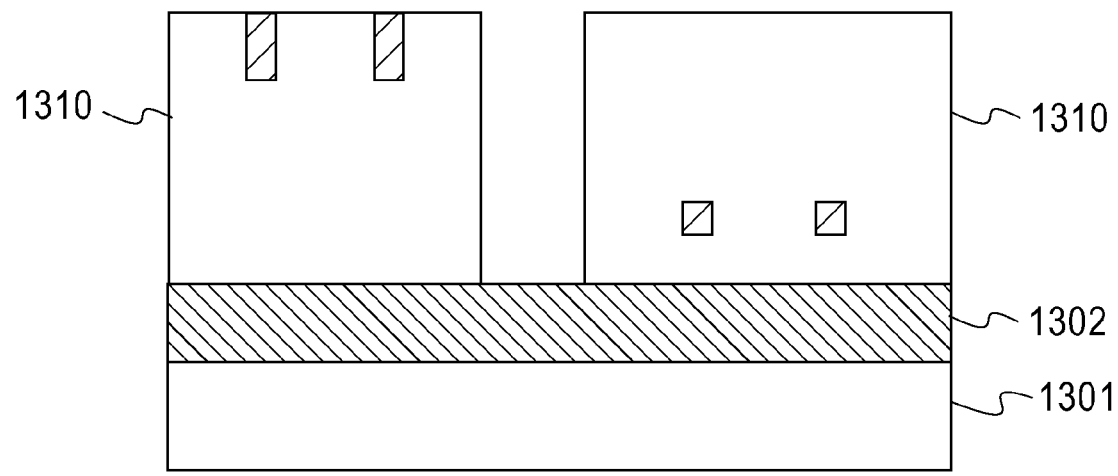
Figure 13H:
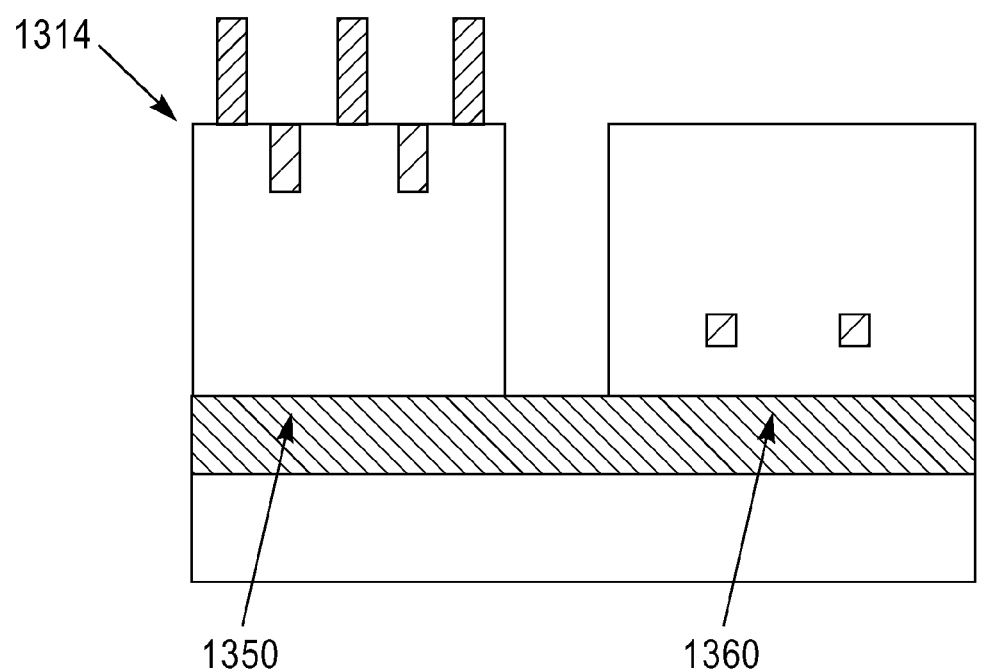

The silicon dioxide 1306 maybe etched to form fins 1308 (FIG. 13D). The gate electrode 1310 (e.g., polysilicon) may be deposited and planarized (e.g., using etchback/CMP) (FIG. 13E). The back-gate electrode may be etched until a tall fin oxide 1312 is exposed (FIG. 13F). The electrode material (e.g., polysilicon) 1310 may be patterned and etched (FIG. 13G). Sources and drains (not shown) may be formed and wires 1314 (e.g., SIT wires) may be formed (FIG. 13H). As illustrated in FIG. 13H, the method 1300 may result in nFETs (split gate) 1350 and pFETs (double-gate) 1360.

In short, the memory cell according to the exemplary aspects of the present invention, may include a plurality of nFETs which may include an asymmetric gate workfunction. In particular, the plurality of pFETs may operate in double-gate symmetrical mode, and the plurality of nFETs may include asymmetrical double-gates. Further, the memory cell may include a finFET asymmetrical back-gate structure, the plurality of nFETs including a plurality of stacked nFETs. In addition, in the memory cell, a back-gate bias can exceed a supply voltage in active mode and can be reduced below ground (e.g., in a standby mode).

Another aspect of the present invention includes a static random access memory (SRAM) cell, including a plurality of back-gated FETs including back-gate biasing adjusted to the operating conditions of the cell, and a plurality of double-gated FETs. The back-gate biasing may be reverse biased for low power during a standby operation, or forward biased for high speed during a read operation.

With its unique and novel features, the present invention provides a novel semiconductor structure in which back-gates may be formed with relatively less layout complexity. The present invention also provides a method for forming the novel semiconductor structure. The present invention may also help to increase the device density of the novel semiconductor structure, improve the stability of an SRAM device by coupling the back-gates of the proper nFET devices in the SRAM, and may also be used to apply a proper biasing condition.

The present invention may also be used to provide Vt tailoring, Vt adjustment, preventing Vt scatter in SRAM based on operation, high performance, low leakage and improved power. The present invention may also be especially applicable in logic devices, analog devices and phase locked loop (PLL) circuits.

While the invention has been described in terms of one or more exemplary embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

The invention claimed is:

1. A memory cell, comprising:
   a plurality of back-gated n-type field effect transistors (nFETs); and
   a plurality of double-gated p-type field effect transistors (pFETs) operatively coupled to said plurality of nFETs, wherein said plurality of back-gated nFETs comprises a first nFET having a finFET structure and a second nFET having a finFET structure, a back-gate of said second nFET being coupled to a back-gate of said first nFET, and
   wherein said back-gate of said first nFET and said back-gate of said second nFET are coupled to a body bias generator for supplying a back-gate bias to said first and second nFETs, said back-gate bias being at least equal to Vdd for said memory cell in active mode and being not greater than ground in a standby mode.

2. The memory cell of claim 1, wherein said first nFET comprises a pull-down nFET and said second nFET comprises a pass-gate nFET, and said plurality of pFETs includes a pair of pull-up pFETs.

3. The memory cell of claim 2, wherein said pair of pFETs comprises a finFET structure.

4. The memory cell of claim 1, wherein said plurality of nFETs include asymmetrical double-gates, and said plurality of pFETs operate in a double-gate symmetrical mode.

5. The memory cell of claim 1, wherein said plurality of nFETs comprises a plurality of stacked nFETs having a finFET asymmetrical back-gate structure.

6. The memory cell of claim 1, wherein said back-gate bias exceeds a supply voltage in said active mode and is below ground in said standby mode.

7. The memory cell of claim 1, wherein said plurality of double-gated pFETs include back-gated pFETs.

8. The memory cell of claim 2, wherein said plurality of nFETs further comprises a third nFET having a finFET structure and a fourth nFET having a finFET structure, a back-gate of said third nFET being coupled to a back-gate of said fourth nFET.

9. The memory cell of claim 8, wherein said third nFET comprises a pull-down nFET and said fourth nFET comprises a pass-gate nFET.

10. The memory cell of claim 9, wherein said back-gates of said third and fourth nFETs are coupled to said body bias generator for supplying said back-gate bias to said third and fourth nFETs.

11. The memory cell of claim 1, wherein said body bias generator generates a reverse bias for low power during said standby mode, and a forward bias for high speed during a read operation.

12. The memory cell of claim 1, wherein said memory cell is included in a static random access memory (SRAM) having a wordline driver, said body bias generator being derived through one stage before said wordline driver.

13. The memory cell of claim 12, wherein, when said wordline goes high, said plurality of nFETs are biased high by said body bias generator which decreases a threshold voltage of said plurality of nFETs.

14. A method of back-gate biasing, comprising:
   providing a memory cell comprising:
      first and second pass-gate nFETs and first and second pull-down nFETs having a finFET structure and having a backgate coupled to a body bias generator; and
      a plurality of double-gated p-type field effect transistors (pFETs) operatively coupled to said pass-gate nFETs and said pull-down nFETs;
   in an active mode, using said body bias generator to supply a back-gate bias which is at least equal to Vdd for said memory cell to said first and second pass-gate nFETs and said first and second pull-down nFETs; and
   in a standby mode, using said body bias generator to supply a back-gate bias which is not greater than ground to said first and second pass-gate nFETs and said first and second pull-down nFETs.

15. The method of claim 14, further comprising:
generating said back-gate bias by using a body bias generator which is coupled to a back-gate of said first and second pass-gate nFETs and a back-gate of said first and second pull-down nFETs.

16. A memory cell, comprising:
a first pass-gate n-type field effect transistor (nFET) having a finFET structure and a gate coupled to a word line;
a second pass-gate nFET having a finFET structure and a gate coupled to said word line;
a first pull-down nFET having a finFET structure, a back-gate of said first pull-down nFET being coupled to a back-gate of said first pass-gate nFET;
a second pull-down nFET having a finFET structure, a back-gate of said second pull-down nFET being coupled to a back-gate of said second pass-gate nFET; and
a first double-gated pull-up p-type field effect transistor (pFET) having a finFET structure and having an arm coupled to an arm of said first pass-gate nFET and said first pull-down nFET;
a second double-gated pull-up pFET having a finFET structure and having an arm coupled to an arm of said second pass-gate nFET and said second pull-down nFET;
wherein said back-gate of said first and second pass-gate nFETs and said back-gate of said first and second pull-down nFETs are coupled to a body bias generator for supplying a back-gate bias to said first and second pass-gate nFETs and said first and second pull-down nFETs, said back-gate bias being at least equal to Vdd for said memory cell in active mode and being below ground in a standby mode.

* * * * *